(12) United States Patent
Louie et al.

(10) Patent No.: US 10,255,978 B2
(45) Date of Patent: Apr. 9, 2019

(54) LOOP CONTROL STROBE SKEW

(71) Applicant: SANDISK TECHNOLOGIES LLC, Plano, TX (US)

(72) Inventors: Kenneth Louie, Sunnyvale, CA (US); Qui Nguyen, San Jose, CA (US); Tai-yuan Tseng, Milpitas, CA (US); Jong Yuh, Pleasanton, CA (US); Ohwon Kwon, Pleasanton, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/589,120

(22) Filed: May 8, 2017

(65) Prior Publication Data

US 2018/0322928 A1    Nov. 8, 2018

(51) Int. Cl.
*G11C 16/10* (2006.01)
*G11C 16/26* (2006.01)

(52) U.S. Cl.
CPC .............. *G11C 16/26* (2013.01); *G11C 16/10* (2013.01)

(58) Field of Classification Search
CPC ...................................................... G11C 16/10
USPC ..................................................... 365/185.19
See application file for complete search history.

(56) References Cited

U.S. PATENT DOCUMENTS

| 7,751,250 | B2 | 7/2010 | Lee et al. |
| 7,944,757 | B2 | 5/2011 | Moschiano et al. |
| 9,123,430 | B2 | 9/2015 | Cernea |
| 9,202,579 | B2 | 12/2015 | Hsiung et al. |
| 9,472,298 | B1 | 10/2016 | Louie et al. |
| 9,543,030 | B1 | 1/2017 | Amarnath et al. |
| 9,564,219 | B2 | 2/2017 | Magia et al. |
| 2014/0119126 | A1* | 5/2014 | Dutta ................... G11C 11/5628 365/185.19 |
| 2016/0012903 | A1 | 1/2016 | Desai et al. |
| 2016/0300607 | A1 | 10/2016 | Magia et al. |

* cited by examiner

*Primary Examiner* — Jason Lappas
(74) *Attorney, Agent, or Firm* — Foley & Lardner LLP

(57) ABSTRACT

This disclosure provides a method and apparatus for applying a dynamic strobe signal to a plurality of sense modules during programming of an array of memory cells, where a characteristic of the dynamic strobe signal is configured to limit a peak current level through the plurality of sense modules. An example apparatus the array of memory cells, a plurality of bit lines spanning the array of memory cells, and the plurality of sense modules connected to the bit lines. The plurality of sense modules enable sensing of states of memory cells. A controller determines the characteristic of the dynamic strobe signal, where the dynamic strobe signal is varied based on the determined characteristic.

15 Claims, 13 Drawing Sheets

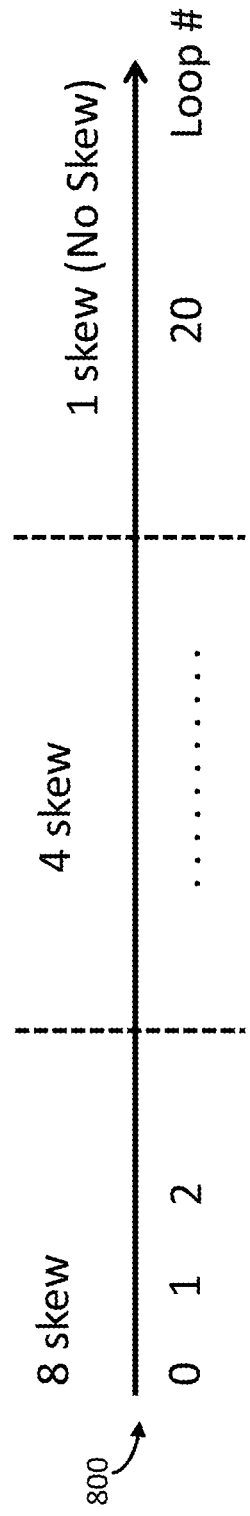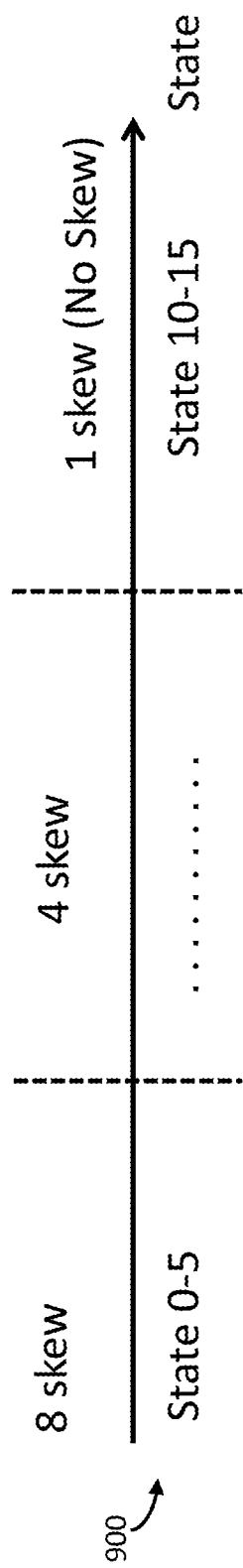

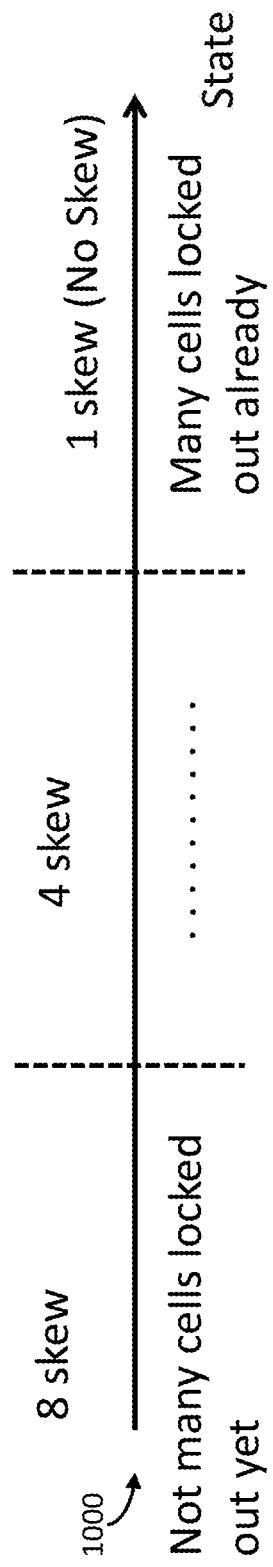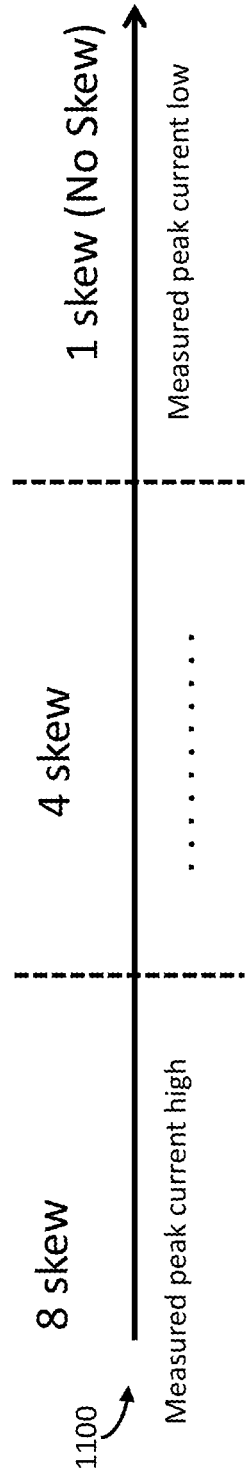

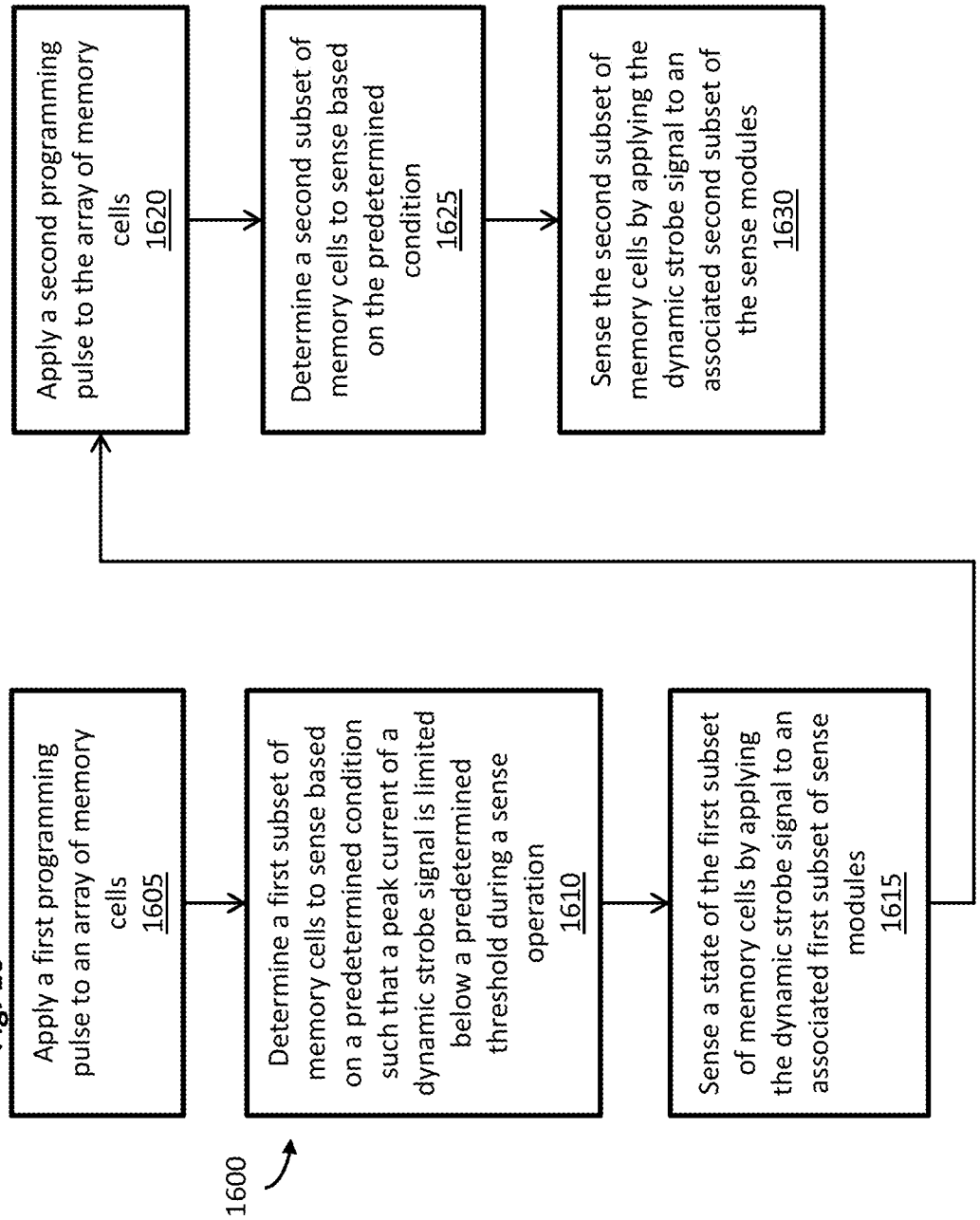

LOOP CONTROL STROBE SKEW

BACKGROUND

The present disclosure relates to technology for non-volatile storage.

Semiconductor memory has become more popular for use in various electronic devices. For example, non-volatile semiconductor memory is used in cellular telephones, digital cameras, personal digital assistants, mobile computing devices, non-mobile computing devices and other devices. When semiconductor memory is used in consumer electronic devices, it is desirable to minimize the amount of power used by the semiconductor memory, minimize the amount of time it takes to program the semiconductor memory, and ensure that all data is stored accurately so as to protect data from corruption. Additionally, consumers want the semiconductor memory to perform reliably at sufficient speeds. Therefore, improvements to semiconductor memory provide more reliable data and a better customer experience.

SUMMARY

The systems, methods and devices of this disclosure each have several innovative characteristics, no single one of which is solely responsible for the desirable attributes disclosed herein.

One innovative characteristic of the subject matter described in this disclosure can be implemented in an apparatus including an array of memory cells, a plurality of bit lines spanning the array of memory cells, and a plurality of sense modules connected to the bit lines. The plurality of sense modules may enable sensing of states of memory cells. The electronic circuit may further include a controller that is configured to apply programming pulses to the array of memory cells. The controller may also determine a characteristic of a dynamic strobe signal. The characteristic of the dynamic strobe signal is configured to limit a peak current level through the plurality of sense modules. For example, the peak current level of the dynamic strobe signal may be limited while the programming pulses are applied to the array of memory cells. The controller is further configured to apply the dynamic strobe signal to the plurality of sense modules to sense, via the bit lines, a state of the memory cells. The dynamic strobe signal can vary based on the determined characteristic of the dynamic strobe signal. The dynamic strobe signal may vary in different ways according to various embodiments disclosed herein.

In an embodiment, the characteristic for the dynamic strobe signal includes a first number of sense modules to which the dynamic strobe signal is to be applied at a first time during the programming pulses. The first number of sense modules may represent a first subset of the total plurality of sense modules. In this way, the dynamic strobe signal is not applied to all of the plurality of sense modules at one time, limiting the peak current level through the plurality of sense modules at any given time. In an embodiment, the number of sense modules to which the dynamic strobe signal is applied to at the first time may be based on a program loop number of the programming pulses. For example, each of the programming pulses may be part of a programming sequence, where each of the programming pulses has a unique program loop number. In some embodiments, the program pulses may be associated with different types of programming of the memory cells, such as erase, read, write, etc. The controller can be configured to determine how many sense modules to which the dynamic strobe signal is applied based on the unique program loop number, which may be associated with different types of programming. In some embodiments, a look up table (LUT) may be used, where the number of sense modules to apply the dynamic strobe signal to is correlated to the program loop number in the LUT. In some embodiments, the dynamic strobe signal is applied to an increasing number of the plurality of sense modules as the programming sequence proceeds and the unique program loop numbers get higher.

In some embodiments, the number of sense modules to which the dynamic strobe signal is applied is based on a predicted peak current of the dynamic strobe signal. For example, a controller may predict how high a peak current will be based on how many memory cells are already locked out and therefore do not need to be sensed. In another example, the controller may predict how high the peak current will be based on a type of programming pulse that is being applied. In another example, the controller may predict how high the peak current will be based on the unique program loop number of the programming pulse being applied.

After the dynamic strobe signal is applied to a first number of sense modules at a first time according to the determined characteristic, the dynamic strobe signal is applied to a second number of sense modules at a second time according to the determined characteristic. The second number of sense modules may include a second subset of the plurality of sense modules. In various embodiments, the dynamic strobe signal may be applied to the sense modules after each time a programming pulse is applied to the memory cells. The second subset of the plurality of sense modules may be a larger number of memory cells than the first subset of memory cells. In some embodiments, the first subset of memory cells may be locked out at the second time.

The characteristic of the dynamic strobe signal configured to limit the peak current level may be one or more different types of characteristics. In some embodiments, the characteristic may be a variable strobe skew for the dynamic strobe signal, where the dynamic strobe signal is applied to a different number of sense modules for each programming loop of the memory cells. A variable strobe skew refers to a strobe signal that can be varied over time with respect to the number of sense modules to which the strobe signal is applied. That is, a variable strobe signal can have a different skew value over time. This variable strobe skew can be used to limit the peak current of level through the plurality of sense modules, while still providing efficient programming and sensing for the memory cells. That is, the skew used to apply the dynamic strobe signal may be varied at different rates. In some embodiments, the characteristic of the dynamic strobe signal that may be used to limit the peak current is a measurement of the actual peak current flowing to the plurality of sense modules via the dynamic strobe signal. In other words, the number of sense modules to which the dynamic strobe signal is sent may be varied based on a measurement of the current flowing to the sense modules.

Another innovative characteristic of the subject matter described in this disclosure can be implemented in a non-transitory computer readable medium having instructions thereon that, upon execution by a computing device, cause the computing device to perform operations. The operations may include applying a first programming pulse to an array of memory cells. The operations may further include determining a first subset of memory cells to sense based on a predetermined condition. The first subset of memory cells is configured to limit a peak current of a dynamic strobe signal to be below a predetermined threshold during a sense operation. The operations may further include sensing a state of the first subset of memory cells by applying the dynamic strobe signal to an associated first subset of sense modules. The first subset of sense modules may be connected to a plurality of bit lines spanning the array of memory cells. The operations may further include applying a second programming pulse to the array of memory cells. Each of the memory cells may include transistors that are configured to be programmed to one of sixteen states. In some embodiments, the memory cells may be programmed to different numbers of states than sixteen.

The operations discussed above may further include determining a second subset of memory cells to sense based on the predetermined condition and sensing, after the second programming pulse, the second subset of memory cells by applying the dynamic strobe signal to an associated second subset of the sense modules. In some embodiments, the predetermined condition may be whether the memory cells are in an erase state. For example, the first subset of memory cells may be memory cells in an erase state, while the second subset of memory cells may be memory cells in a non-erase state. Often, sensing a memory cell that is in an erase state draws more current than sensing a memory cell in a non-erase state. Accordingly, sensing some erase state cells with the dynamic strobe signal first and some non-erase state cells with the dynamic strobe signal second can limit the peak current level through the sense modules to an appropriate level, while still completing program loops and sense operations efficiently. In some embodiments, the predetermined condition may be a program loop count of a plurality of programming pulses, such that the memory cells that are sensed at a given time is based on how many program loops have been performed at the given time. As memory cells become programmed and/or locked out, more cells may be sensed with the dynamic strobe signal without exceeding an acceptable current level of the dynamic strobe signal.

Another innovative characteristic of the subject matter described in this disclosure can be implemented in a method including applying a first programming pulse to an array of memory cells along wordlines of the array. The method may further include sensing, after applying the first programming pulse, a state of a first group of the memory cells associated with a first group of latches. The method may further include applying a second programming pulse to the array of memory cells. The method may further include sensing, after applying the second programming pulse, a second group of the memory cells associated with a second group of latches. The second group of latches may include a different number of latches than the first group of latches.

In some embodiments, the first and second groups of memory cells may be determined such that a peak current of a signal used to sense the first and second groups of memory cells is limited below a predetermined threshold. The peak current is related to how many latches flip during a sense operation of the memory cells. In some embodiments, the first and second groups of memory cells are determined based on a program loop count of a plurality of programming pulses. In some embodiments, the first and second groups of memory cells are determined based on a type of programming pulse applied to the array of memory cells. In some embodiments, the first and second groups of memory cells are determined based on a known state of the memory cells. In some embodiments, the first and second groups of memory cells are determined based on a measured peak current of the dynamic strobe signal.

Another innovative characteristic of the subject matter described in this disclosure can be implemented in an apparatus including means for applying a first programming pulse to an array of memory cells along wordlines of the array. The apparatus may further include means for determining a first pulse width for a dynamic strobe signal based on a predetermined condition. The first pulse width may be configured to limit a peak current of the dynamic strobe signal below a predetermined threshold during a sense operation. The apparatus may further include means for sensing a state of the memory cells by applying, at a first time, the dynamic strobe signal with the first pulse width to a plurality of sense modules connected to a plurality of bit lines spanning the array. The apparatus may further include means for applying a second programming pulse to the array of memory cells.

BRIEF DESCRIPTION OF THE DRAWINGS

FIG. 8 depicts a method for applying a dynamic strobe signal by applying a variable strobe skew based on a program loop number in accordance with an illustrative embodiment.

FIG. 9 depicts a method for applying a dynamic strobe signal by applying a variable strobe skew based on memory cell states in accordance with an illustrative embodiment.

FIG. 10 depicts a method for applying a dynamic strobe signal by applying a variable strobe skew based on lock out states of the memory cells in accordance with an illustrative embodiment.

FIG. 11 depicts a method for applying a dynamic strobe signal by applying a variable strobe skew based on a measured peak current in accordance with an illustrative embodiment.

FIG. 16 depicts a method of operation of a circuit used to apply a dynamic strobe signal based on a predetermined condition in accordance with an illustrative embodiment.

DETAILED DESCRIPTION

Figures 1, 2:
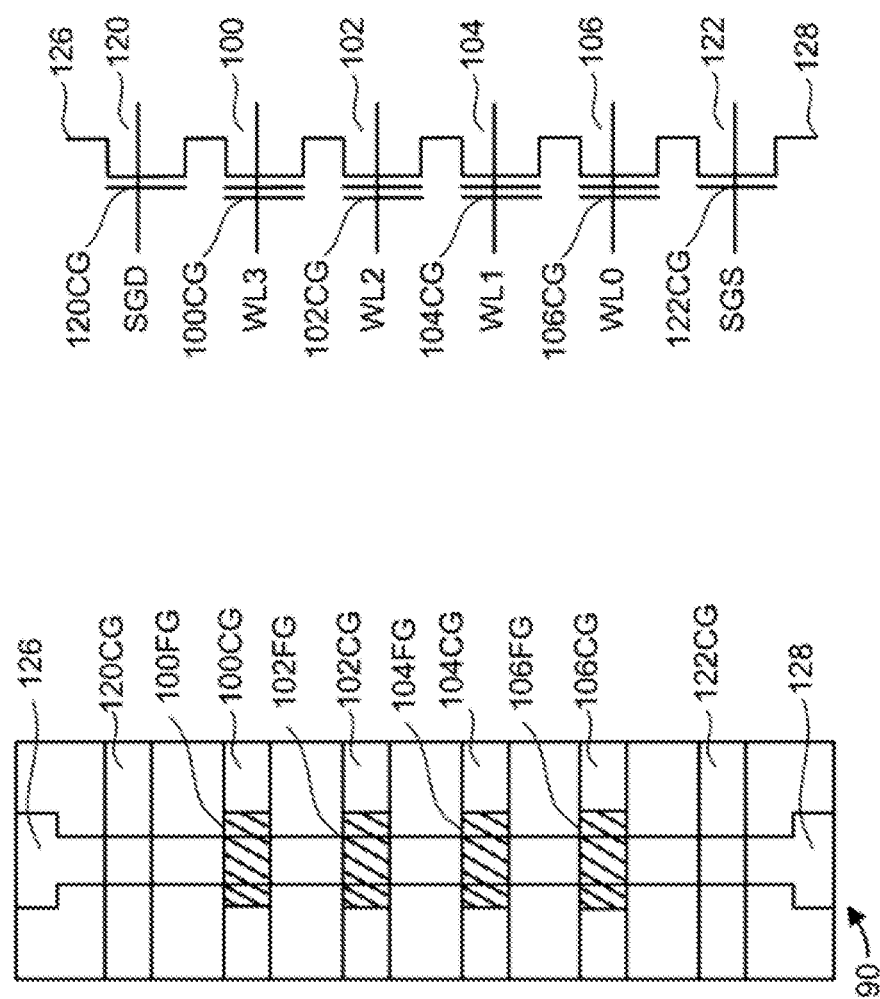
FIG. 1 depicts one embodiment of a NAND string in accordance with an illustrative embodiment.
FIG. 2 depicts one embodiment of the NAND string of FIG. 1 using a corresponding circuit diagram.

Reference will now be made to various embodiments, one or more examples of which are illustrated in the figures. The embodiments are provided by way of explanation of the invention, and are not meant as a limitation of the invention. For example, features illustrated or described as part of one embodiment may be used with another embodiment to yield still a further embodiment. It is intended that the present application encompass these and other modifications and variations as come within the scope and spirit of the invention.

Disclosed herein is a technology directed to non-volatile memory that is capable of programming memory cells to a large number of possible states. For example, memory cells that store four bits of data (or sixteen total states) may be used. The higher the capacity of the memory cells, the larger a voltage range may need to be to accurately program each memory cell to such a wide range of states, as each state represents a different threshold voltage that is stored in the memory cell.

In order to accommodate the higher voltage range used to program such high capacity memory cells, a pumped supply may be used as disclosed herein. In various embodiments, a means for applying programming pulses to an array of memory cells along wordlines of an array may include a pumped supply that provides a dynamic strobe signal, a controller to control characteristics of the dynamic strobe signal, a sense module as described herein, other logic hardware, and/or other executable code stored on a computer readable storage medium. Other embodiments may include similar or equivalent means for applying programming pulses to an array of memory cells along wordlines of an array. In various embodiments, a means for sensing a state of memory cells by applying a dynamic strobe signal with a particular pulse width to a plurality of sense modules connected to a plurality of bit lines spanning the array or memory cells may include a pumped supply that provides the dynamic strobe signal, a controller to control characteristics of the dynamic strobe signal, a sense module as described herein, other logic hardware, and/or other executable code stored on a computer readable storage medium. Other embodiments may include similar or equivalent means for sensing a state of memory cells. A pumped supply can provide a high voltage used to program high capacity memory cells, but may have limits as to how much current and loading such a pumped supply can provide.

Accordingly, disclosed herein are methods and apparatuses to provide a pumped supply that can be used to sense and program memory cell states, while limiting the peak current levels flowing from the pumped supply. For example, systems and methods as disclosed herein may include an integrated circuit with on-chip circuitry to generate a boosted voltage having a magnitude that is greater than the highest power supply voltage provided to the integrated circuit. The boosted voltage may be used for providing power to portions of the electronic circuitry located on the integrated circuit. The boosted voltage may be generated using an on-chip charge pump system.

In some cases, a charge pump system may be used to generate an output voltage that is greater than the highest supply voltage provided to the integrated circuit. In other cases, a charge pump system may be used to generate an output voltage that is less than the lowest supply voltage provided to the integrated circuit (e.g., a negative charge pump system may generate a voltage that is less than ground). Accordingly, programming pulses may be applied to an array of memory cells along wordlines of an array using such pumped supplies.

Various ways of limiting the peak current levels are disclosed herein. For example, a dynamic strobe signal may be applied to sense modules of the memory cells from the pumped supply. A dynamic strobe signal, used throughout, is a strobe signal applied to sense modules of a memory array that can be varied over time according to various characteristics. In certain embodiments, the characteristics may include a strobe skew, a pulse width duration, pulse magnitude, number of cells to include in each strobe signaling operation, or any other suitable characteristics. Various characteristics of the dynamic strobe signal may be adjusted or changed throughout the programming loops to ensure that the peak current from the pumped supply is limited to a desired level. For example, during early program loops, when there are more erase states that draw more current, the dynamic strobe signal may have a higher skew. Additionally, during earlier program loops, more data latches may flip, even for cells that are not being programmed to an erase state. During the later program loops, after many cells are already programmed and locked out, the skew can be set lower so that the dynamic strobe signal is applied to a larger number of cells. In other words, the dynamic strobe signal may be sent to fewer sense modules/memory cells during the earlier program loops than the later loops. In some embodiments, a system may measure the current levels flowing out from the pumped supply to further dynamically adjust the number of cells that are sensed during a given (or subsequent) program loops. In some embodiments, the pulse width of the dynamic strobe signal may be varied for different program loops to ensure that the peak current drawn from the pumped supply is properly limited. Various other methods and combinations of these methods are contemplated and disclosed herein.

In addition, the characteristics of the dynamic strobe signal may be varied based on a data pattern being applied to a plurality of memory cells. For example, a plurality of 1s and 0s may be applied to the plurality of memory cells for which conducting cells are used for the is while non-conductive cells are used for the 0s. Thus, in an embodiment where a data pattern is applied such that there are a larger number of conducting cells a longer pulse width may be used, while a shorter width may be used for embodiments in which a data pattern is applied such that there are fewer conducting cells. In alternative embodiments, characteristics of the dynamic strobe signal other than pulse width may be varied based on the data pattern. Additionally, cells adjacent to multiple neighboring cells of a given type (i.e., conducting or non-conducting) may exhibit a similar type as their neighboring cells. Thus, the type of neighboring cells may be further considered in determining how a characteristic of the dynamic strobe signal is to be varied.

A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM). Both flash memory and EEPROM utilize floating-gate transistors. For each floating-gate transistor, a floating gate is positioned above and insulated from a channel region of the floating-gate transistor. The channel region is positioned between source and drain regions of the floating-gate transistor. A control gate is positioned above and insulated from the floating gate. The threshold voltage of the floating-gate transistor may be controlled by setting the amount of charge stored on the floating gate. The amount of charge on the floating gate is typically controlled using Fowler-Nordheim (F-N) tunneling or hot-electron injection. The ability to adjust the threshold voltage allows a floating-gate transistor to act as a non-volatile storage element or memory cell. In some cases, more than one data bit per memory cell (i.e., a multi-level or multi-state memory cell) may be provided by programming and reading multiple threshold voltages or threshold voltage ranges.

NAND flash memory structures typically arrange multiple floating-gate transistors in series with and between two select gates. The floating-gate transistors in series and the select gates may be referred to as a NAND string. In recent years, NAND flash memory has been scaled in order to reduce cost per bit. Various NAND flash memories may be used according to the various embodiments disclosed herein. The technology disclosed herein may also be applied to other types of non-volatile storage devices and architectures (e.g., NOR-type flash memory). Moreover, although technology using floating-gate transistors is described herein, the technology described herein may also be applied to or used with other memory technologies including those that employ charge trapping, phase-change (e.g., chalcogenide materials), or state-change materials. In addition, various characteristics of the systems and methods shown in U.S. Pat. No. 9,543,030; U.S. patent application Ser. No. 14/681,627; U.S. Pat. No. 9,123,430; or U.S. Pat. No. 9,472,298 may be utilized in combination with the systems and methods disclosed herein, each of which are hereby incorporated herein in their entirety. The systems and methods disclosed herein may also be useful in applications that utilize ramp sensing and/or other sensing operations. U.S. Pat. No. 9,543,030 demonstrates non-voltatile memory sense amplifiers that can support both ramp sensing and other sensing operations.

An architecture for a flash memory system using a NAND flash memory structure includes a plurality of NAND strings within a memory block. A memory block may comprise a unit of erase. In some cases, the NAND strings within a memory block may share a common well (e.g., a P-well). Each NAND string may be connected to a common source line by its source-side select gate (e.g., controlled by select line SGS) and connected to its associated bit line by its drain-side select gate (e.g., controlled by select line SGD). Typically, each bit line runs on top of (or over) its associated NAND string in a direction perpendicular to the word lines and is connected to a sense amplifier.

In some embodiments, during a programming operation, storage elements that are not to be programmed (e.g., storage elements that have previously completed programming to a target data state) may be inhibited or locked out from programming by boosting associated channel regions (e.g., self-boosting the channel regions via word line coupling). An unselected storage element (or unselected NAND string) may be referred to as an inhibited or locked out storage element (or inhibited NAND string) as it is inhibited or locked out from programming during a given programming iteration of a programming operation.

Although technology using NAND-type flash memory may be described herein, the technology disclosed herein may also be applied to other types of non-volatile storage devices and architectures (e.g., NOR-type flash memory). Moreover, although technology using floating-gate transistors is described herein, the technology described herein may also be applied to or used with other memory technologies including those that employ charge trapping, phase-change (e.g., chalcogenide materials), or state-change materials.

FIG. 1 depicts an example of a NAND string 90 in accordance with an illustrative embodiment. FIG. 2 depicts one embodiment of the NAND string of FIG. 1 using a corresponding circuit diagram. As depicted, NAND string 90 includes four transistors, 100, 102, 104, and 106, in series between a first select gate 120 (i.e., a drain-side select gate) and a second select gate 122 (i.e., a source-side select gate). Select gate 120 connects the NAND string 90 to a bit line 126. Select gate 122 connects the NAND string 90 to a source line 128. Select gate 120 is controlled by applying the appropriate voltage to control gate 120CG (i.e., via select line SGD of FIG. 2). Select gate 122 is controlled by applying the appropriate voltage to control gate 122CG (i.e., via select line SGS of FIG. 2). Each of the transistors 100, 102, 104, and 106 includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gates 100CG, 102CG, 104CG, and 106CG are connected to word lines WL3, WL2, WL1, and WL0, respectively.

Note that although FIGS. 1 and 2 show four floating-gate transistors in the NAND string, the use of four floating-gate transistors is only provided as an example. A NAND string may have less than or more than four floating-gate transistors (or memory cells). For example, some NAND strings may include 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

Figure 3:
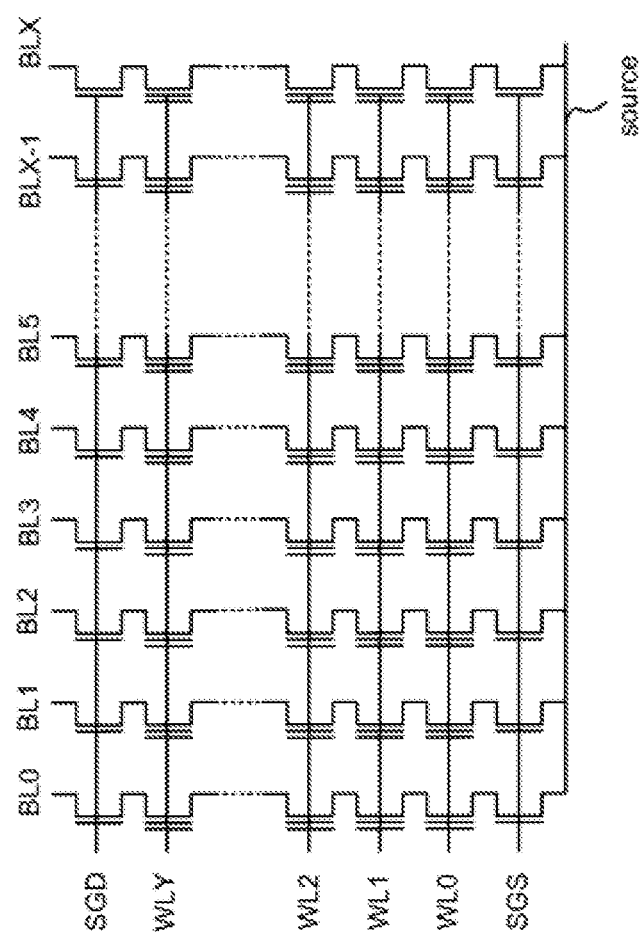
FIG. 3 depicts one embodiment of a memory block including a plurality of NAND strings in accordance with an illustrative embodiment.

FIG. 3 depicts one embodiment of a memory block including a plurality of NAND strings. As depicted, each NAND string includes (Y+1) memory cells. Each NAND string is connected to one bit line out of (X+1) bit lines on the drain side (i.e., one bit line of bit lines BL0-BLX) via a drain-side select gate controlled by the drain-side selection signal SGD. Each NAND string is connected to a source line (source) via a source-side select gate controlled by source-side selection signal SGS. In one embodiment, the source-side select gate controlled by source-side selection signal SGS and the drain-side select gate controlled by the drain-side selection signal SGD may comprise transistors without floating gates or transistors that include a floating gate structure.

In one embodiment, during a programming operation, when programming a memory cell, such as a NAND flash memory cell, a program voltage may be applied to the control gate of the memory cell and the corresponding bit line may be grounded. These programming bias conditions may cause electrons to be injected into the floating gate via field-assisted electron tunneling, thereby raising the threshold voltage of the memory cell. The program voltage applied to the control gate during a program operation may be applied as a series of pulses. In some cases, the magnitude of the programming pulses may be increased with each successive pulse by a predetermined step size. Between programming pulses, one or more verify operations may be performed. During the programming operation, memory cells that have reached their intended programming states may be locked out and inhibited from programming by boosting the channel regions of the program inhibited memory cells.

In one embodiment, memory cells may be erased by raising the p-well to an erase voltage (e.g., 20 volts) for a sufficient period of time and grounding the word lines of a selected block of memory cells while the source and bit lines are floating. These erase bias conditions may cause electrons to be transferred from the floating gate through the tunneling oxide, thereby lowering the threshold voltage of the memory cells within the selected block. In some cases, an erase operation may be performed on an entire memory plane, on individual blocks within a memory plane, or another unit of memory cells.

In some embodiments, during verify operations and/or read operations, a selected word line may be connected (or biased) to a voltage, a level of which is specified for each read and verify operation in order to determine whether a threshold voltage of a particular memory cell has reached such level. After applying the word line voltage, the conduction current of the memory cell may be measured (or sensed) to determine whether the memory cell conducted a sufficient amount of current in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell may be measured by the rate it discharges or charges a dedicated capacitor in a sense amplifier. In another example, the conduction current of the selected memory cell allows (or fails to allow) the NAND string that included the memory cell to discharge a voltage on the corresponding bit line. The voltage of the bit line (or the voltage across a dedicated capacitor in a sense amplifier) may be measured after a period of time to determine whether the bit line has been discharged by a particular amount or not.

Figure 4:
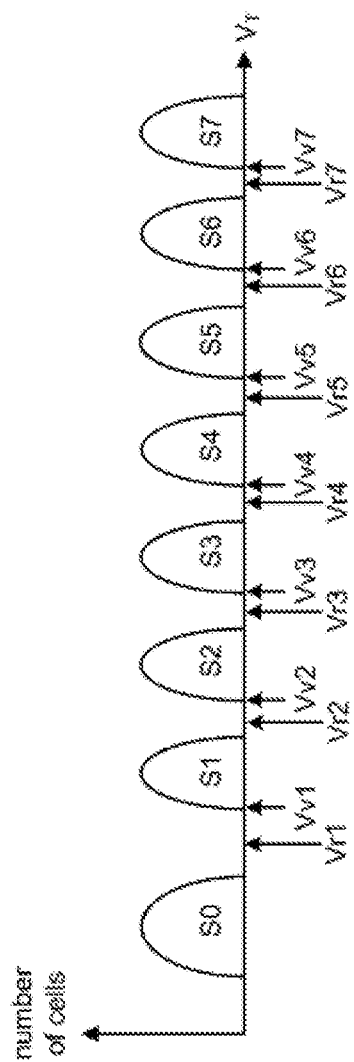
FIG. 4 depicts one embodiment of possible threshold voltage distributions for a three-bit-per-cell memory cell in accordance with an illustrative embodiment.

FIG. 4 depicts one embodiment of possible threshold voltage distributions (or data states) for a three-bit-per-cell memory cell (i.e., the memory cell may store three bits of data). Other embodiments, however, may use more than or less than three bits of data per memory cell (e.g., such as four or more bits of data per memory cell). As disclosed herein, the methods of applying a dynamic strobe signal may be more valuable where more bits of data per memory cell are used. For example, four bits of data per memory cell may be used (providing sixteen states total for a memory cell). At the end of a successful programming process (with verification), the threshold voltages of memory cells within a memory page or memory block should be within one or more threshold voltage distributions for programmed memory cells or within a distribution of threshold voltages for erased memory cells, as appropriate.

As depicted, each memory cell may store three bits of data; therefore, there are eight valid data states S0-S7. In one embodiment, data state S0 is below 0 volts and data states S1-S7 are above 0 volts. In other embodiments, all eight data states are above 0 volts, or other arrangements can be implemented. In one embodiment, the threshold voltage distribution S0 is wider than distributions S1-S7. In an embodiment that has more states (e.g., sixteen or S0-S15), more than one threshold may be below 0 volts.

Each data state S0-S7 corresponds to a unique value for the three bits stored in the memory cell. In one embodiment, S0=111, S1=110, S2=101, S3=100, S4=011, S5=010, S6=001 and S7=000. Other mappings of data to states S0-S7 can also be used. In one embodiment, all of the bits of data stored in a memory cell are stored in the same logical page. In other embodiments, each bit of data stored in a memory cell corresponds to different pages. Thus, a memory cell storing three bits of data would include data in a first page, a second page, and a third page. In some embodiments, all of the memory cells connected to the same word line would store data in the same three pages of data. In some embodiments, the memory cells connected to a word line can be grouped into different sets of pages (e.g., by odd and even bit lines). As disclosed herein, a memory cell that stores four bits of data may have four pages, so that the memory cell can store sixteen possible states.

In some example implementations, the memory cells will be erased to state S0. As disclosed herein, many states may be set to an erase state at the beginning of a programming process. Because sensing an erased cell can cause a greater current draw from the pumped supply to sense the state of the cell (due to a greater number of sense latches flipping), a dynamic strobe signal used during the erase operations may be varied to sense a fewer number of cells during the beginning erase loops, as disclosed herein. From state S0, the memory cells can be programmed to any of states S1-S7. Programming may be performed by applying a set of pulses with rising magnitudes to the control gates of the memory cells. Between pulses, a set of verify operations may be performed to determine whether the memory cells being programmed have reached their target threshold voltage (e.g., using verify levels Vv1, Vv2, Vv3, Vv4, Vv5, Vv6, and Vv7). Memory cells being programmed to state S1 will be tested to see if their threshold voltage has reached Vv1. Memory cells being programmed to state S2 will be tested to see if their threshold voltage has reached Vv2. Memory cells being programmed to state S3 will be tested to see if their threshold voltage has reached Vv3. Memory cells being programmed to state S4 will be tested to see if their threshold voltage has reached Vv4. Memory cells being programmed to state S5 will be tested to see if their threshold voltage has reached Vv5. Memory cells being programmed to state S6 will be tested to see if their threshold voltage has reached Vv6. Memory cells being programmed to state S7 will be tested to see if their threshold voltage has reached Vv7. As the memory cells increase in the threshold voltages they store, less current is used to sense and verify the levels of each cell. Accordingly, as disclosed herein, more cells can be sensed during these later programming loops.

When reading memory cells that store three bits of data, multiple reads will be performed at read compare points Vr1, Vr2, Vr3, Vr4, Vr5, Vr6, and Vr7 to determine which state the memory cells are in. If a memory cell turns on in response to Vr1, then it is in state S0. If a memory cell turns on in response to Vr2 but does not turn on in response to Vr1, then it is in state S1. If a memory cell turns on in response to Vr3 but does not turn on in response to Vr2, then it is in state S2. If a memory cell turns on in response to Vr4 but does not turn on in response to Vr3, then it is in state S3. If a memory cell turns on in response to Vr5 but does not turn on in response to Vr4, then it is in state S4. If a memory cell turns on in response to Vr6 but does not turn on in response to Vr5, then it is in state S5. If a memory cell turns on in response to Vr7 but does not turn on in response to Vr6, then it is in state S6. If a memory cell does not turn on in response to Vr7, then it is in state S7. Similar systems can be used with fewer or additional state levels as disclosed herein.

Figure 5A:
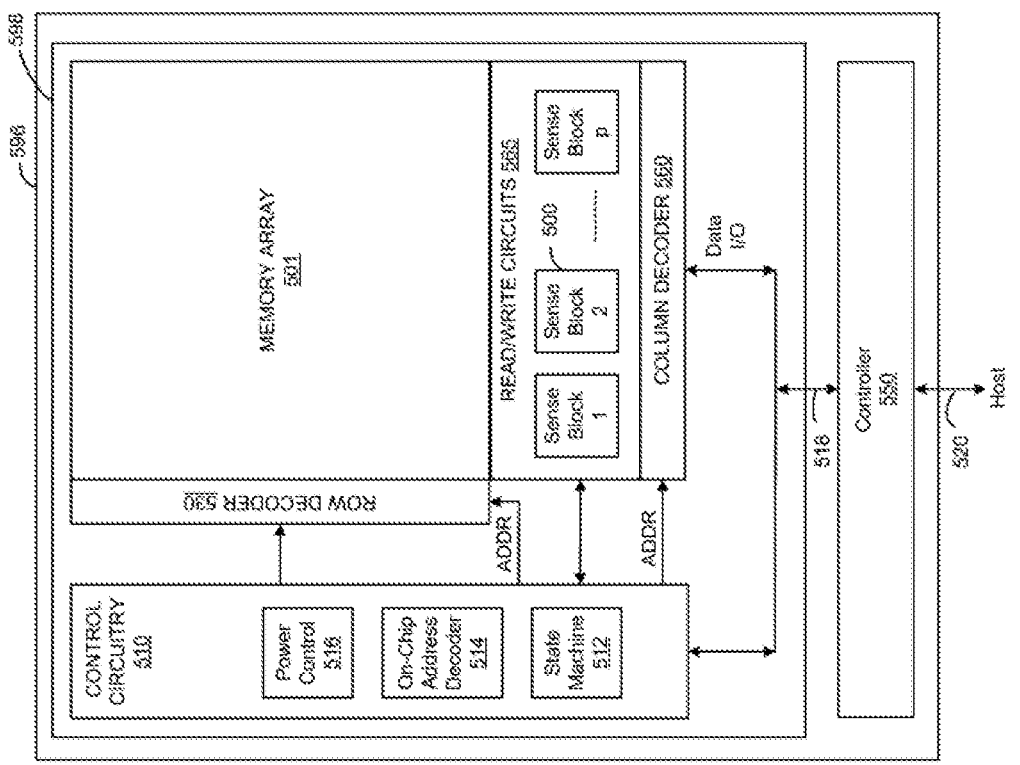
FIG. 5A depicts one embodiment of a non-volatile storage system in accordance with an illustrative embodiment.

FIG. 5A depicts one embodiment of a non-volatile storage system 596 including read/write circuits for reading and programming a page (or other unit) of memory cells (e.g., NAND multi-level cells) in parallel. As depicted, non-volatile storage system 596 includes a memory die 598 and controller 550. Memory die 598 includes a memory array 501 (e.g., a NAND flash memory array, such an array using the NAND strings described above with respect to FIGS. 1-4), control circuitry 510, row decoder 530, column decoder 560, and read/write circuits 565. In one embodiment, access to the memory array 501 by the various peripheral circuits (e.g., row decoders or column decoders) is implemented in a symmetric fashion, on opposite sides of the array, so that the densities of access lines and circuitry on each side are reduced by half. The memory array 501 is addressable by word lines via a row decoder 530 and by bit lines via a column decoder 560. Word lines and bit lines are examples of memory array control lines. The read/write circuits 565 include multiple sense blocks 500 that allow a page of storage elements to be read or programmed in parallel. In some cases, controller 550 may be integrated on the memory die 598. Commands and data are transferred between the host and controller 550 via lines 520 and between the controller 550 and the memory die 598 via lines 518.

The control circuitry 510 cooperates with the read/write circuits 565 to perform memory operations on the memory array 501. The control circuitry 510 includes a state machine 512, an on-chip address decoder 514, and a power control module 516. The state machine 512 provides chip-level control of memory operations. The on-chip address decoder 514 provides an address interface between the addresses used by the host and the hardware addresses used by the decoders 530 and 560. The power control module 516 controls the power and voltages supplied to the word lines and bit lines during memory operations. In one embodiment, a power control module 516 includes one or more charge pumps that may generate voltages greater than the supply voltage. The power control module 516 may, in some embodiments, include drivers for word line layers (discussed below) in a 3D configuration, select transistors (e.g., SGS and SGD transistors, described below) and source lines. The power control module 516 may also include charge pumps for creating voltages. The controller 550 and/or the control circuitry 510 may control a dynamic strobe signal applied to the sense blocks 500 as disclosed herein to limit peak current flowing from a pumped power supply. In various embodiments a means for applying programming pulses to the memory array 501 along wordlines of the array, determining a pulse width for a dynamic strobe signal based on a predetermined condition such that the pulse width is configured to limit a peak current of the dynamic strobe signal below a predetermined threshold during a sense operation, and controlling signals for sensing a state of the memory cells by applying the dynamic strobe signal with the pulse width to a plurality of sense modules connected to a plurality of bit lines spanning the memory array 501 may include the controller 550, the control circuitry 510, power control module 516, other logic hardware, and/or other executable code stored on a computer readable storage medium. Other embodiments may include similar or equivalent means for determining a pulse width for a dynamic strobe signal based on a predetermined condition such that the pulse width is configured to limit a peak current of the dynamic strobe signal below a predetermined threshold during a sense operation, and controlling signals for sensing a state of the memory cells by applying the dynamic strobe signal with the pulse width to a plurality of sense modules connected to a plurality of bit lines spanning the memory array.

In some embodiments, one or more of the components (alone or in combination), other than memory array 501, may be referred to as a managing or control circuit. For example, one or more managing or control circuits may include any one of or a combination of control circuitry 510, state machine 512, decoders 530/560, power control 516, sense blocks 500, read/write circuits 565, and/or controller 550. The one or more managing circuits or the one or more control circuits may perform or facilitate one or more memory array operations including erasing, programming, or reading operations.

In some embodiments, one or more managing or control circuits may be used for controlling the operation of a memory array, such as memory array 501. The one or more managing or control circuits may provide control signals to the memory array in order to perform a read operation and/or a write operation on the memory array. In one example, the one or more managing or control circuits may include any one of or a combination of control circuitry, state machine, decoders, sense amplifiers, read/write circuits, and/or controllers. The one or more control circuits may enable or facilitate one or more memory array operations including erasing, programming, or reading operations to be performed on the memory array. In one example, the one or more control circuits may comprise an on-chip memory controller for determining row and column addresses, word line and bit line addresses, memory array enable signals, and/or data latching signals.

In one embodiment, memory array 501 may be divided into a large number of blocks (e.g., blocks 0-1023, or another amount) of memory cells. As is common for flash memory systems, the block may be the unit of erase. That is, each block may contain the minimum number of memory cells that are erased together. Other units of erase can also be used. A block contains a set of NAND strings which are accessed via bit lines and word lines. Typically, all of the NAND strings in a block share a common set of word lines.

Each block may be divided into a particular number of pages. In one embodiment, a page may be the unit of programming. Other units of programming can also be used. One or more pages of data are typically stored in one row of memory cells. For example, one or more pages of data may be stored in memory cells connected to a common word line. In one embodiment, the set of memory cells that are connected to a common word line are programmed simultaneously. A page can store one or more sectors. A sector may include user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECC and/or other overhead data may be stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages, and sectors can also be used.

Figure 5B:
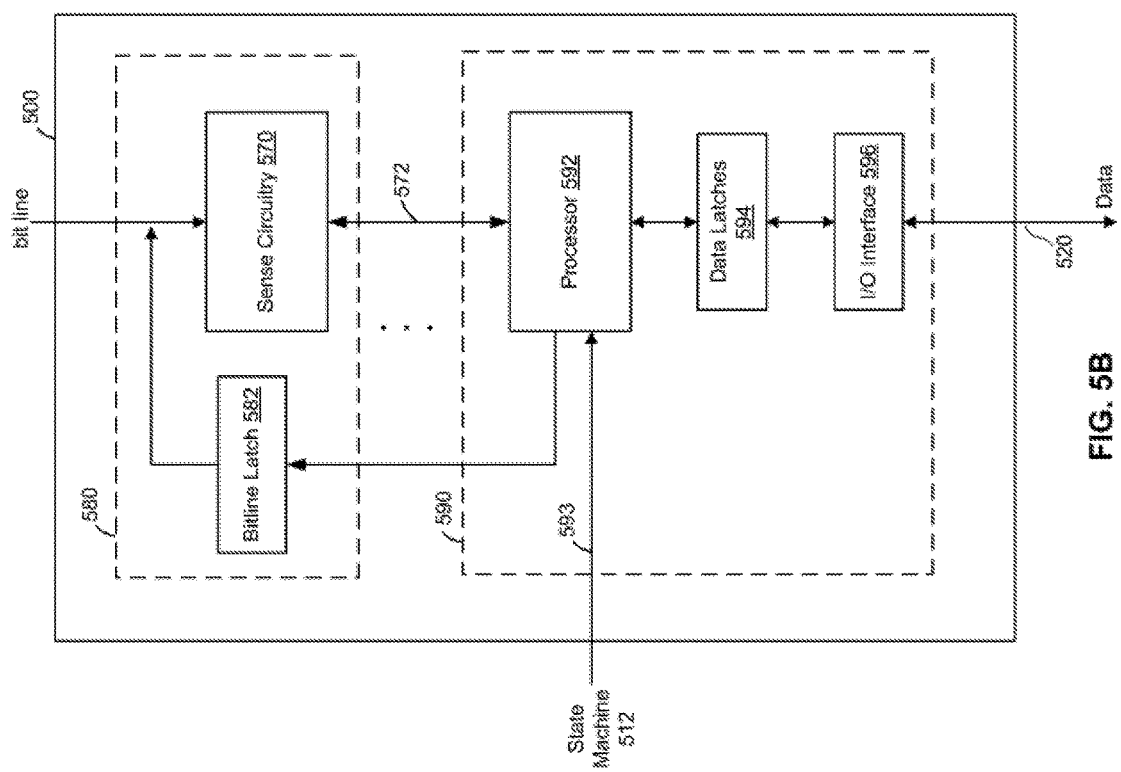
FIG. 5B depicts one embodiment of a sense block in accordance with an illustrative embodiment.

FIG. 5B depicts one embodiment of a sense block 500, such as sense block 500 in FIG. 5A. An individual sense block 500 may be partitioned into a core portion, referred to as a sense module 580, and a common portion 590. In one embodiment, there is a separate sense module 580 for each bit line and one common portion 590 for a set of multiple sense modules 580. In one example, a sense block may include one common portion 590 and eight sense modules 580. Each of the sense modules in a group may communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 may result in the connected bit line being pulled to a state designating program inhibit voltage (e.g., 1.5-3 V). A strobe signal as disclosed herein can be applied to the sense module 580 to determine whether the condition is met for the connected bit line. In various embodiments, a means for sensing a state of the memory cells by receiving an applied strobe signal that may have a particular pulse width may include the sense module 580, other logic hardware, and/or other executable code stored on a computer readable storage medium. Other embodiments may include similar or equivalent means for sensing a state of the memory cells by receiving an applied strobe signal that may have a particular pulse width.

Common portion 590 comprises a processor 592, a set of data latches 594, and an I/O Interface 596 coupled between the set of data latches 594 and data bus 520. Processor 592 performs computations. For example, processor 592 may determine the data stored in the sensed storage element and store the determined data in the set of data latches. The set of data latches 594 may be used to store data bits determined by processor 592 during a read operation or to store data bits imported from the data bus 520 during a program operation. The imported data bits represent write data meant to be programmed into a memory array, such as memory array 501 in FIG. 5A. I/O interface 596 provides an interface between data latches 594 and the data bus 520. In various embodiments, a means for determining a pulse width or strobe skew based on a predetermined condition, where the pulse width or strobe skew is configured to limit a peak current of the dynamic strobe signal below a predetermined threshold during a sensing operation may include the processor 592, other logic hardware, and/or other executable code stored on a computer readable storage medium. Other embodiments may include similar or equivalent means for determining a pulse width or strobe skew based on a predetermined condition. In various embodiments, a means for controlling such a sensing operation, such that a state of memory cells is senses by applying dynamic strobe signal to a plurality of sense modules connected to a plurality of bit lines spanning the array may include the processor 592, other logic hardware, and/or other executable code stored on a computer readable storage medium. Other embodiments may include similar or equivalent means for controlling such a sensing operation.

During a read operation or other storage element sensing operation, a state machine, such as state machine 512 in FIG. 5A, controls the supply of different control gate voltages to the addressed storage elements. In some cases, as it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves both as a latch for latching the output of the sense module 580 and as a bit line latch as described above.

During a programming operation, the data to be programmed is stored in the set of data latches 594. The programming operation, under the control of the state machine 512, comprises a series of programming voltage pulses applied to the control gates of the addressed storage elements. Each program pulse is followed by a read back (or verify process) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit voltage. This inhibits the storage element coupled to the bit line from further programming even if program pulses appear on its control gate. In other embodiments, the processor initially loads the bit line latch 582 and the sense circuitry sets it to an inhibit value during the verify process. When the bit line latch 582 is at an inhibit state, the latch 582 no longer needs to draw current (i.e., the memory cell associated with the bit line is inhibited from further programming, or locked out). In this way, the systems and methods disclosed herein provide for a strobe signal that can be to greater numbers of memory cells as the programming loops are carried out, because a greater number of memory cells will be programmed as the programming loops are carried out. In various embodiments, a means for determining a pulse width or strobe skew for a dynamic strobe signal based on a predetermined condition by determining, for example, how many memory cells/bit line latches 582 are locked out may include the processor 592, other logic hardware, and/or other executable code stored on a computer readable storage medium. Other embodiments may include similar or equivalent means for determining a pulse width or strobe skew for a dynamic strobe signal based on a predetermined condition.

Data latch stack 594 contains a stack of data latches corresponding to the sense module. In one embodiment, there are three data latches per sense module 580. The data latches can be implemented as a shift register so that the parallel data stored therein is converted to serial data for data bus 520, and vice-versa. All the data latches corresponding to a read/write block can be linked together to form a block shift register so that a block of data can be input or output by serial transfer. In particular, the bank of read/write modules may be configured such that each of its set of data latches will shift data in to or out of the data bus in sequence as if they are part of a shift register for the entire read/write block.

In some embodiments, a non-volatile storage system, such as non-volatile storage system 596 in FIG. 5A, may be implemented using an integrated circuit. The integrated circuit may include on-chip circuitry to generate a boosted voltage having a magnitude that is greater than the highest power supply voltage provided to the integrated circuit. The boosted voltage may be used for providing power to portions of the electronic circuitry located on the integrated circuit. The boosted voltage may be generated using an on-chip charge pump system. In some cases, a charge pump system may be used to generate an output voltage that is greater than the highest supply voltage provided to the integrated circuit. In other cases, a charge pump system may be used to generate an output voltage that is less than the lowest supply voltage provided to the integrated circuit (e.g., a negative charge pump system may generate a voltage that is less than ground).

Figure 6:
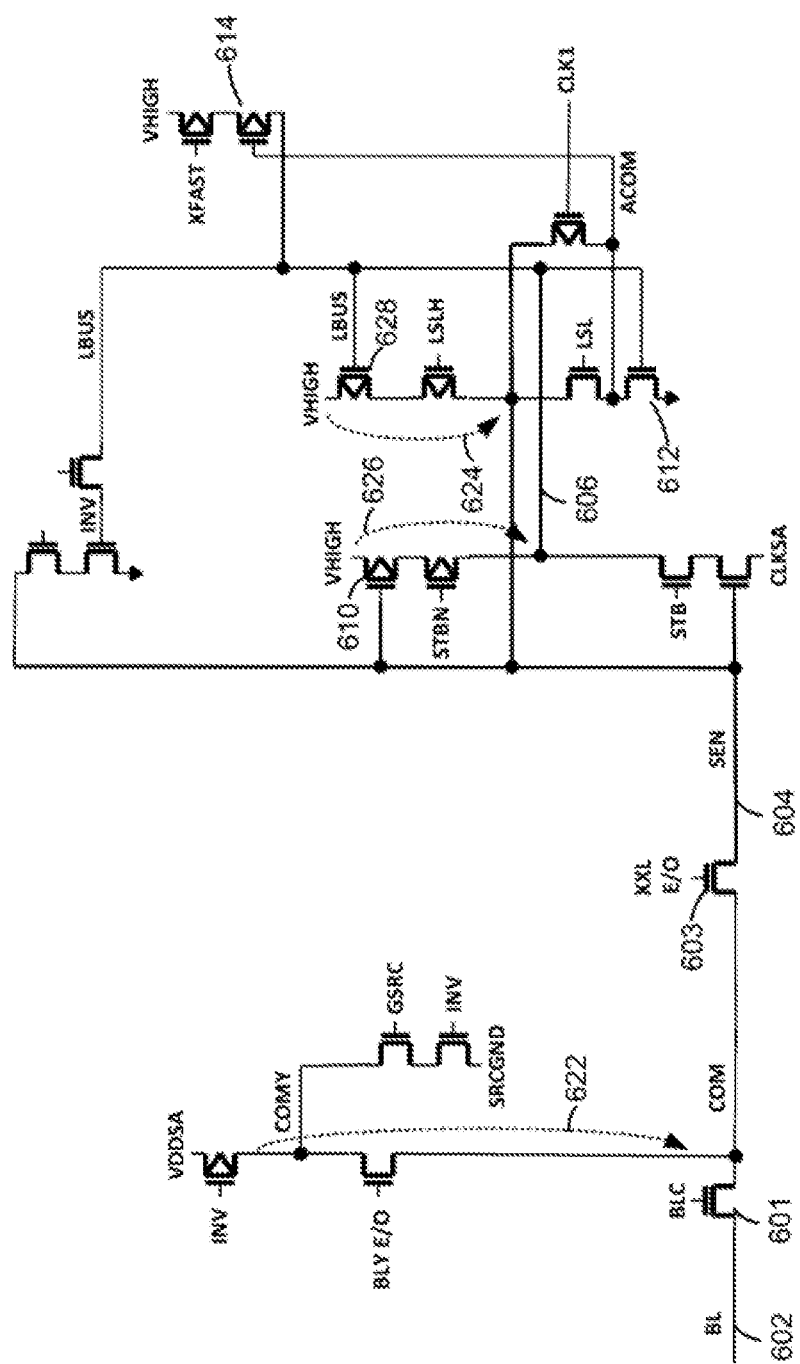
FIG. 6 depicts one embodiment of a portion of a sense amplifier in accordance with an illustrative embodiment.

FIG. 6 depicts one embodiment of a portion of a sense amplifier. In various embodiments, a means for sensing a state of memory cells by applying a strobe signal to the sense amplifier may include the sense amplifier of FIG. 6, other logic hardware, and/or other executable code stored on a computer readable storage medium. Other embodiments may include similar or equivalent means for sensing a state of memory cells by applying a strobe signal to the sense amplifier. In various embodiments, other sense amplifiers may be used such as the one depicted in FIG. 7 below. In some cases, the portion of the sense amplifier may correspond with a portion of sense module 580 in FIG. 5B. As depicted, the portion of the sense amplifier includes a bit line BL 602 connected at the source side of an NMOS transistor 601 with a gate controlled by BLC. During a sensing operation, the NMOS transistor 601 may be set into a source follower configuration in which the bit line is biased to a bit line voltage via application of the appropriate voltage to BLC (e.g., setting BLC to roughly an NMOS transistor threshold voltage above the bit line voltage). The NMOS transistor threshold voltage may be elevated due to the body effect. The precharge path for precharging the bit line BL 602 may be via precharge path 622.

Prior to sensing current drawn from the bit line BL 602 during the sensing operation, the bit line BL 602 may be precharged to a first voltage VDDSA (e.g., 2V) and the sensing node SEN 604 that is electrically coupled to the bit line BL 602 may be precharged to a second voltage VHIGH that is greater than the first voltage (e.g., 4V) via a precharge path 624 for precharging the sensing node. In order to initiate a sensing operation, part of a strobe signal STB may be applied. As disclosed herein, such a strobe signal may be dynamic, in that it is applied to the various sensing modules in a memory array in such a way that the peak current drawn from VHIGH through the sense modules is limited to a particular peak value using the various methods and systems disclosed herein. As disclosed herein, VHIGH may be provided by a pumped supply to provide the voltage necessary for the sensing operation. During the sensing operation, as charge is drawn from the sensing node, the voltage at the sensing node may reduce or drop from the second voltage. As the voltage of the sensing node SEN 604 drops, the voltage of the feedback node LBUS 606 may increase via the sensing path 626 as PMOS transistor 610 turns on or is set into a conducting state.

In one embodiment, if the sensing node SEN 604 drops more than a PMOS transistor threshold voltage below the second voltage VHIGH, then the feedback node LBUS 606 may be charged up via the sensing path 626. As the voltage of the feedback node LBUS 606 is increased, the NMOS transistor 612 may be turned on or set into a conducting state causing the PMOS transistor 614 to be turned on or set into a conducting state. As the drain of the PMOS transistor 614 is connected to the feedback node LBUS 606, the active pull-up via the PMOS transistor 614 may quickly raise the voltage of the feedback node LBUS 606 to the second voltage VHIGH. Once the feedback node LBUS 606 has been pulled up to the second voltage, the precharge path 624 for precharging the sensing node SEN 604 may be disabled as the PMOS transistor 628 has been turned off or set into a non-conducting state. If the feedback node LBUS 606 has not been charged up to a voltage sufficient to turn off the PMOS transistor 628, then the sensing node SEN 604 will be precharged during a subsequent precharge phase for a subsequent sensing operation via the precharge path 624. FIG. 6 B of U.S. Pat. No. 9,543,030, which is incorporated herein in its entirety, depicts one embodiment of voltage waveforms corresponding with operation of the portion of the sense amplifier depicted in FIG. 6 of the present application.

Figure 7:
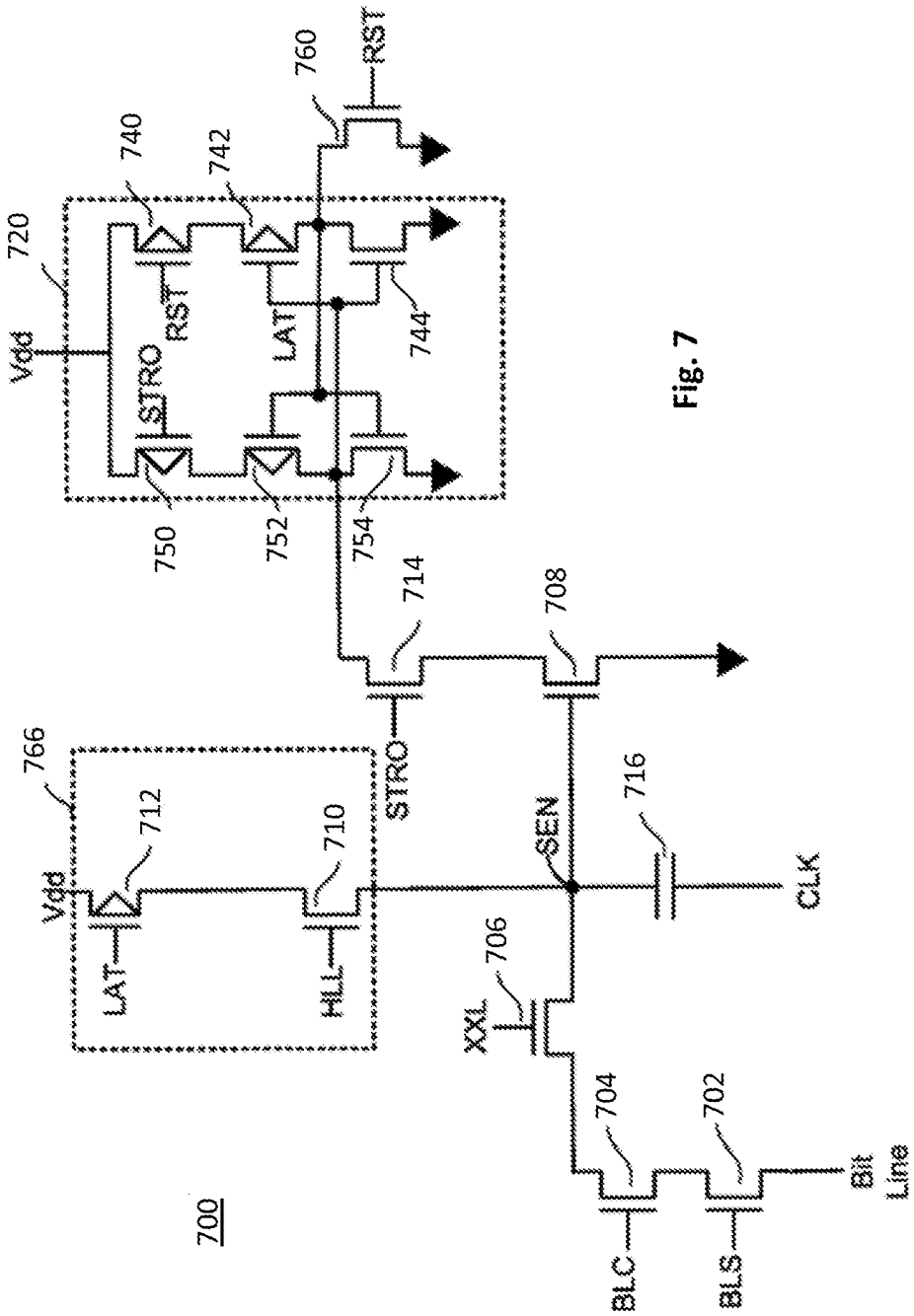
FIG. 7 depicts another embodiment of a portion of a sense amplifier in accordance with an illustrative embodiment.

FIG. 7 depicts another portion of a sensing module that may be used according to various embodiments as disclosed herein. In various embodiments, a means for sensing a state of memory cells by applying a strobe signal to the sense module may include the sense module of FIG. 7, other logic hardware, and/or other executable code stored on a computer readable storage medium. Other embodiments may include similar or equivalent means for sensing a state of memory cells by applying a strobe signal to the sense module. The circuit 700 of FIG. 7 shows transistor 702 connected to the Bit Line and transistor 704. Transistor 702 receives the signal BLS at its gate, and is used to connect to or isolate the Bit Line. Transistor 704 receives the signal BLC at its gate, and is used as a voltage clamp. The gate voltage BLC is biased at a constant voltage equal to the desired Bit Line voltage plus the threshold voltage of transistor 704. The function of transistor 704, therefore, is to maintain a constant Bit Line voltage during a sensing operation (during read or verify), even if the current through the Bit Line changes.

Transistor 704 is connected to transistor 706. Transistor 706 is connected to capacitor 716. The purpose of transistor 706 is to connect capacitor 716 to the Bit Line and disconnect capacitor 716 from the Bit Line so that capacitor 716 is in selective communication with Bit Line. In other words, transistor 706 regulates the sensing time. That is, while transistor 706 is turned on capacitor 716 can discharge through the Bit Line, and when transistor 706 is turned off capacitor 716 cannot discharge through the Bit Line.

The SEN node at which transistor 706 connects to capacitor 716 is also connected to the gate of sensing transistor 708. Thus, the upper plate of capacitor 716 is connected to the gate of sensing transistor 708. The lower plate of capacitor 716 is connected to clock signal CLK. The purpose of clock signal CLK is to raise or lower the voltage on the upper plate of the capacitor 716, and hence raise or lower the voltage on the sense node SEN.

The SEN node is also connected to transistor 710, which is connected to transistor 712. Both transistor 710 and 712 are in a pre-charge circuit 766. The signal HLL is provided to the gate of transistor 710. The signal LAT is provided to the gate of transistor 712. A purpose of transistors 710 and 712 is to pre-charge the sense node SEN. A voltage (e.g. Vdd or other voltage) is applied to the source of transistor 712.

By appropriately biasing transistors 712 and 710, the voltage applied to the source of transistor 712 can be used to pre-charge capacitor 716. Pre-charging capacitor 716 is one example of establishing conditions for sensing a memory cell. After pre-charging, capacitor 716 can discharge through the Bit Line via transistor 706 (assuming that transistors 702 and 704 are conducting).

The drain of sense transistor 708 is connected to a strobe transistor 714. The gate of the strobe transistor 714 is provide with a strobe signal STRO. A purpose of the strobe transistor 714 is to connect the sensing transistor 708 to the latch circuit 720.

The latch circuit 720 includes transistors 740, 742, 744, 750, 752, and 754. Transistor 750 receives the strobe signal STRO at its gate. Transistor 740 receives a reset signal RST at its gate. The gates of transistors 752 and 754 are tied together. The LAT voltage in the data latch 720 represents a condition of the memory cell. In one embodiment, LAT will be high if the memory cell has threshold voltage at or above the reference level and low if the memory cell has a threshold voltage below the reference level. Thus, a high LAT means that the memory cell has a threshold voltage at or above the reference level, in one embodiment. Thus, a low LAT means that the memory cell has a threshold voltage below the reference level, in one embodiment. According to the methods and systems disclosed herein, the STRO signal may be a dynamic strobe signal used to control how many memory cells are sensed at a time, or a time that certain memory cells are controlled to sense a state of a memory cell. For example, as disclosed herein, a dynamic strobe signal may be applied to a smaller number of sense modules 700 during earlier program loops than during later program loops to limit the total peak current drawn from Vdd (also referred to herein as VHIGH in other embodiments). In another example, as disclosed herein, different pulse widths (duration of time the strobe signal is applied) may be used for the dynamic strobe signal to ensure that each of the memory cells being sensed can be properly sensed, while still limiting a total peak current drawn from Vdd.

A reset transistor 760 is connected to the gates of transistors 752 and 754. The gate of reset transistor 760 is provided with the reset signal RST. Thus, the reset signal RST may be used to reset the latch 720. Note that although only one latch circuit 720 is depicted in FIG. 7, circuit 700 may have two or more latch circuits 720. In this case, the circuit 700 may be configured to store results in a selected latch circuit 720.

As discussed above, capacitor 716 is pre-charged via transistors 710 and 712. This will raise the voltage at the node SEN to a pre-charge voltage level (Vpre). When transistor 706 turns on, capacitor 716 can discharge its charge through the Bit Line and the selected memory cell if the threshold voltage of the memory cell is below the reference voltage level being tested for. If the capacitor 716 is able to discharge, then the voltage at the capacitor (at the SEN node) will decrease.

The pre-charge voltage (Vpre) at the SEN node is greater than the threshold voltage of transistor 708; therefore, prior to the sense time, transistor 708 is on (conducting). Since transistor 708 is on during the sense time, then transistor 714 should be off. If the capacitor 716 does not discharge during the sense time, then the voltage at the SEN node will remain above the threshold voltage of transistor 708. With the sense transistor 708 on and transistor 714 on LAT in the data latch 720 goes high, in one embodiment.

If the capacitor 716 discharges sufficiently during the sense time, then the voltage at the SEN node will decrease below the threshold voltage of transistor 708, thereby turning off transistor 708. In this case, LAT in the data latch 720 will be low, in one embodiment. The voltage at LAT in the data latch 720 may be provided to managing circuitry outside of the sense circuit 700. In one embodiment, a compliment of the voltage at LAT in the data latch 720 is provided to managing circuitry outside of the sense circuit 700. Thus, the condition of the memory cell with respect to a reference level (e.g., threshold voltage) may be determined by the sense circuit 700 and/or by managing circuitry outside of the sense circuit 700. FIG. 1 of U.S. Pat. No. 9,472,298, which is incorporated herein in its entirety, depicts one embodiment of voltage waveforms corresponding with operation of the portion of the sense amplifier depicted in FIG. 7 of the present application.

Accordingly, it should be appreciated that sense modules that are used to sense, read, program, verify, etc. memory cells that have a large number of possible states may utilize a higher voltage supply to ensure that each state can be accurately programmed, verified, read, erased, sensed, etc. In doing so a dynamic strobe signal may be configured according to one or more characteristics to limit the peak current levels flowing to sense modules to an acceptable or predefined level. If the peak current is not limited, a pump supply can collapse, causing a voltage to dip. If a voltage dips too much, cells may not be adequately sensed causing errors in programming cells. Additionally, a pump supply may take a long time to recover from a significant voltage dip, causing programming of memory cells to take longer, which is undesirable. Accordingly, methods and systems are disclosed herein for limiting peak current levels through a plurality of sense modules associated with an array of memory cells.

As discussed above, memory cells can be programmed using a series of programming loops. During the first loops, there are likely to be more highly conducting memory cells, as more memory cells must change state to get to the desired state after programming. As the cells are programmed, fewer and fewer cells must change state as the program loops progress. Additionally, as discussed above, lock out procedures can also be used so that once a cell is programmed, it is locked out. When a cell is locked out, the sensing module (including a sense latch) does not need to draw current, as it is already programmed and locked out. Conversely, latches in the sense modules flip during strobe to program/verify the memory cells that are not yet programmed. Accordingly, during later program loops, there are more programmed cells, so less cells will be conducting, fewer sense latches will flip, and less current will be drawn through the sense latches to program/verify the cells as described above.

When there are many conducting cells (e.g., during earlier program loops), many sense latches will flip, causing a large current draw through the sense latches. However, in various embodiments, there may be limits as to the peak current that can be supplied to the sense modules during any one program loop. Accordingly, the peak current levels through the sense modules can be limited. In one embodiment, the peak current can be limited by using a strobe skew. That is, the strobe signal sent to the sensing latches during programming can be set to a higher skew to limit the number of sense modules that are activated, and subsequently the number of conducting memory cells and latches that can flip, limiting the peak current drawn by the sense modules. Examples of strobe skew schemes according to various embodiments are demonstrated below with respect to FIGS. 8-11. Each of FIGS. 8-13 are oriented from left to right, such that each of the schemes for limiting peak current progress from the left side to the right side over time, program loops, or as otherwise indicated.

FIG. 8 depicts a method 800 for applying a dynamic strobe signal by applying a variable strobe skew based on a program loop number in accordance with an illustrative embodiment. The method 800 demonstrates changing the strobe skew based on program loop numbers. Using a strobe skew, only a certain number of latches are sensed at a time. In order to program the cells most quickly, a strobe signal would be sent to all the cells at once to program them as fast as possible. However, where a peak current through the sensing modules may have to be limited for other reasons as discussed herein, the number of cells sensed can be more limited at the beginning of a set of program loops and then expand to a greater number of cells toward the end of a set of program loops. In this way, the peak current is properly limited at the beginning of the programming process, but the system is still efficient by applying the strobe signal to as many cells as possible as the current drawn by the sense modules decreases as the program loops run.

In FIG. 8, a strobe skew of eight (8) is used for the first three (0, 1, and 2) program loops. This means that the strobe signal is only sent to ⅛ of the total sense modules for a memory cell array in this instance. As the program loops progress past the second loop (e.g., loops 3-19), a strobe skew of four (4) is used, such that the strobe signal is sent to ¼ of the total sense modules for each program loop. For the 20$^{th}$ program loop and after, the method 800 uses a strobe skew of one (1), or no skew, such that a strobe signal is applied to all of the sense modules for the 20$^{th}$ and each subsequent program loop. Because the skew of the strobe signal changes over time, the strobe signal has a variable strobe skew. Accordingly, a higher strobe skew (causing the strobe signal to be sent to fewer sense modules) is used for earlier program loops, while a lower strobe skew (causing the strobe signal to be sent to more sense modules) is used for later program loops. The rate of change of the skew can be changed or adjusted in different embodiments as disclosed herein. In this way, a dynamic strobe signal is applied as disclosed herein. In FIG. 8, a dynamic strobe signal with a variable strobe skew is applied. Accordingly, the characteristic varied of the dynamic strobe signal of FIG. 8 is the total number of sense modules that the strobe signal is sent to for each program loop.

Although FIG. 8 shows skews of 8, 4, and 1, any skew values may be used according to various embodiments. In some embodiments, the thresholds where the skew values are adjusted may also be different. For example, the skew value may change after five program loops, instead of three as shown in FIG. 8. In some embodiments, more or less than three different skew values may be used as well. For example, instead of using three total skew values over the twenty or more program loops, a system may utilize two, four, five, six, seven, eight, or any other number of different skew values that are cycled through as various program loops are completed.

The specifics of the characteristic of a dynamic strobe signal that should be varied (such as strobe skew) may be predetermined based on parameters of the memory cells such as number of states of each cell, total number of cells, total number of sense latches, etc. In some embodiments, these factors may be determined from a look up table (LUT), where particular inputs such as total number of cells or possible memory states for each cell refer to specific factors in an LUT to determine the characteristics for varying the dynamic strobe signal. In some embodiments, determining the characteristics for varying the dynamic strobe signal may itself be a dynamic process. Such a dynamic process can be used wholly to determine characteristics for varying a dynamic strobe signal, or may be used in combination with predetermined characteristics. For example, a controller may measure a peak current flowing through the sense modules. If the peak current is well below what is allowable, the controller may cause the dynamic strobe signal to be sent to a greater number of sense modules sooner, allowing for faster programming of the whole memory array. In some embodiments, the characteristics for varying the strobe signal may begin with predetermined characteristics that are adjusted as various measurements are taken. In some embodiments that measurements may be related to measuring states of the memory cells and/or determining how many memory cells are already locked out. Such measurements can be useful because if cells are locked out they will no longer draw current during a sensing operation, and the current state of a memory cell, whether a cell is fully programmed or not, can be used estimate how much current the cell's associated sense module will draw during a sense operation. Accordingly, the characteristics for varying a dynamic strobe signal can be adjusted based on such measurements to further speed up programming, while still keeping the peak current through the sense modules properly limited. In various embodiments, other measured factors may be used to determine characteristics for varying the dynamic strobe signal. One or more factors may also be used in any combination to determine characteristics for varying a dynamic strobe signal. Such factors may also be used for determining any one or any combination of the other characteristics for varying a strobe signal disclosed herein, including those characteristics described below with respect to FIGS. 9-13.

FIG. 9 depicts a method 900 for applying a dynamic strobe signal by applying a variable strobe skew based on memory cell states in accordance with an illustrative embodiment. In the method 900, the strobe signal can be dynamically changed to have a varying skew based on the states of the memory cells. For example, in some programming and sensing operations, the memory cells are erased to a zero state and then increased during programming loops until they reach a desired state. For example, the memory cells of an array for the method 900 have sixteen possible states (S0, S1, S2 . . . S13, S14, and S15). As each memory cell reaches its desired state, the cell can be locked out so it no longer draws current during a sensing/programming operation. Accordingly, there will be more cells drawing current during the earlier states (e.g., S0 to S5) than the later states (e.g., S10 to S15).

In the example in FIG. 9, a strobe skew of 8 (sense ⅛ of the total cells) is used for programming states S0 to S5, a strobe skew of 4 is used for programming states S6 to S9, and a strobe skew of 1 (no skew) is used for programming states S10 to S15. Therefore, in FIG. 9, a dynamic strobe signal with a variable strobe skew is applied. In various embodiments, the number of states at a particular skew value may be varied, the skew values, and the number of total skew values used may be varied. In various embodiments, the number of states may be varied depending on the number of possible states programmable into the memory cells. In various embodiments, the system may also run more than one program loop for the same programming state. For example, to erase all cells to the S0 state, multiple loops may be run for the S0 state. Such an embodiment may be valuable because the S0 state may result in the largest current draw for programming the memory cells, so limiting the peak current to the sense modules may utilize multiple loops for the earlier states such as S0. As with FIG. 8 described above, various factors as disclosed herein may be utilized or measured to determine precisely how to vary the characteristic of changing the skew based on state of the memory cells as in FIG. 9.

FIG. 10 depicts a method 1000 for applying a dynamic strobe signal by applying a variable strobe skew based on lock out states of the memory cells in accordance with an illustrative embodiment. The method 1000 varies the strobe skew depending on how many memory cells are already locked out. At the beginning of a set of programming loops, none or few of the memory cells may be programmed and locked out. Once a cell is properly programmed and verified, it can be locked out as disclosed herein. Once locked out, the sense module will not draw current when a strobe signal is applied. Accordingly, as more cells are programmed and locked out, fewer cells will draw current as the programming loops occur.

Therefore, the strobe skew of a dynamic strobe signal can vary based on how many memory cells have been locked out. Therefore, in FIG. 10, a dynamic strobe signal with a variable strobe skew is applied. For example, the skew can vary based on a percentage of cells that are locked out. The skew may also vary based on a raw number of cells that are locked out. Additionally, the skew may be varied based on one or more factors as disclosed herein and above with respect to FIG. 8. For example, the skew may be reduced more rapidly than it would strictly based on number of locked out cells on the condition that a program loop number is at a predetermined high threshold. This is advantageous because cells that are not locked out later in the programming loops will draw less current than cells that are not locked out earlier in the programming loops. Accordingly, efficiencies can be gained while still limiting peak current to the sense modules as desired.

FIG. 11 depicts a method 1100 for applying a dynamic strobe signal by applying a variable strobe skew based on a measured peak current in accordance with an illustrative embodiment. According to the method 1100, a strobe skew can be adjusted based on a measured peak current flowing into the sense modules. A current detection may be added to measure current coming out of the pumped power supply and into the sense modules. The current may be measured at, for example, VHIGH of FIG. 6 or Vdd of FIG. 7. The current may be measured in various ways. As just one example, the current may be run through a resistor, and a comparator across the resistor can measure the total peak current flowing to the sense modules.

A controller can then adjust the skew of the dynamic strobe signal according to the measured peak current flowing to the sense modules. For example, the skew may be adjusted whenever the peak current drops below a certain predetermined threshold. There may also be different thresholds that are set to cause the controller to adjust the strobe skew at different magnitudes. For example, if the peak current level drops a first small amount, the controller may adjust the strobe skew slightly so that the next strobe signal is sent to a somewhat larger total of cells on the next programming loop. If the peak current level drops a second large amount, the controller may adjust the strobe skew a lot so that the next strobe signal is sent to a much larger total of cells on the next programming loop. In this way, the system can be highly responsive to fluctuations in the peak current rate to maximize the efficiency of the pumped source and minimize the total time it takes to program the memory array. Additionally, the skew may be varied based on one or more other factors as disclosed herein and above with respect to FIG. 8. Therefore, in FIG. 11, a dynamic strobe signal with a variable strobe skew is applied.

Figure 12:
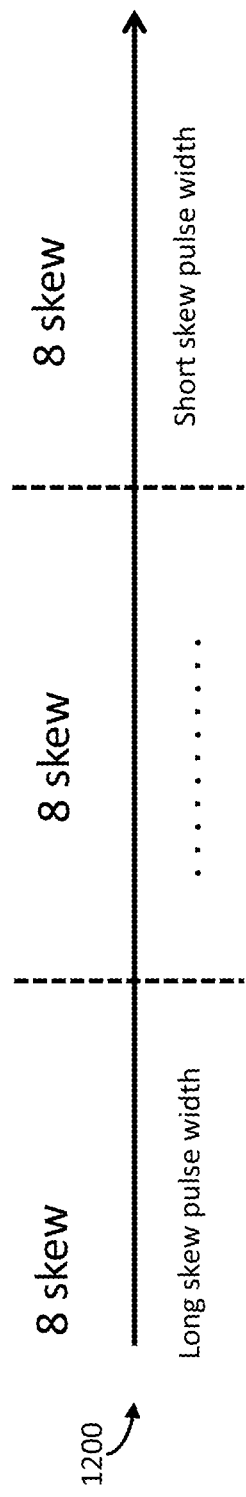
FIG. 12 depicts a method for applying a dynamic strobe signal by applying a constant strobe skew and varying a pulse width of the dynamic strobe signal in accordance with an illustrative embodiment.
Figure 13:
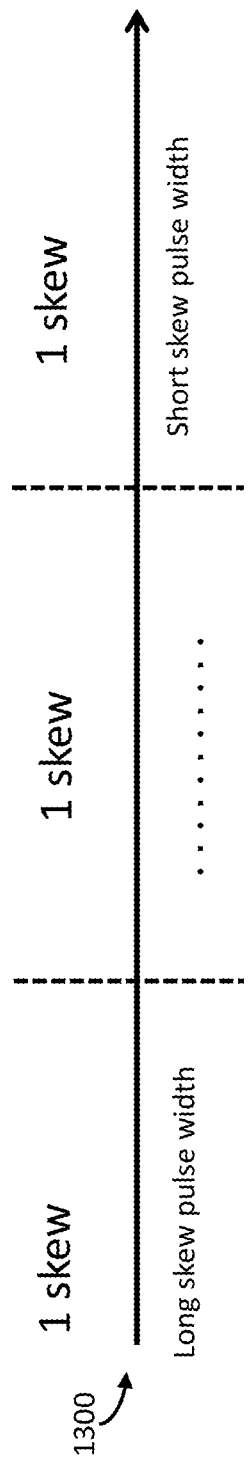
FIG. 13 depicts another method for applying a dynamic strobe signal by applying a constant strobe skew and varying a pulse width of the dynamic strobe signal in accordance with an illustrative embodiment.

FIG. 12 depicts a method 1200 for applying a dynamic strobe signal by applying a constant strobe skew and varying a pulse width of the dynamic strobe signal in accordance with an illustrative embodiment. Instead of varying a strobe skew as in FIGS. 8-11 above, the method 1200 varies a pulse width to effect a dynamic strobe signal. In this way, even if many cells are being sensed, they can receive the necessary current over the longer time of the strobe pulse width. This can be accompanied by a longer pump recovery time where the strobe pulse width is longer. However, as the programming progresses, the current draw is smaller and a shorter pulse width with a shorter pump recovery time can be utilized. The method 1200 shows an 8 skew. However, other skew levels may be used. FIG. 13 depicts another method 1300 for applying a dynamic strobe signal by applying a constant strobe skew and varying a pulse width of the dynamic strobe signal in accordance with an illustrative embodiment. The method 1300 is using no skew. The methods 1200 and 1300 may, in various embodiments also be used in combination with other embodiments disclosed herein, such as those described above with respect to FIGS. 8-11. In addition, the pulse width of a dynamic strobe signal may be varied based on one or more factors as disclosed herein and above with respect to FIG. 8.

Figure 14:
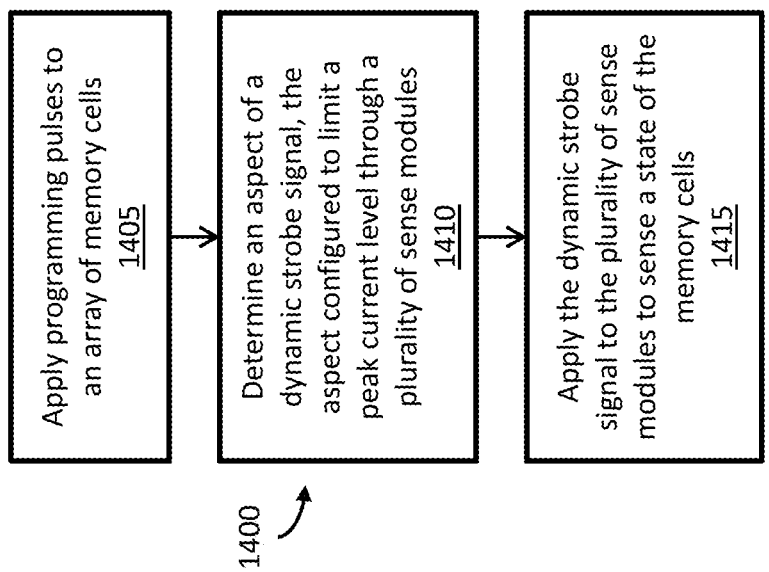
FIG. 14 depicts a method of operation of a circuit used to apply a dynamic strobe signal in accordance with an illustrative embodiment.

FIG. 14 depicts a method of operation of a circuit used to apply a dynamic strobe signal in accordance with an illustrative embodiment. In an operation 1405, programming pulses are applied to the array of memory cells. In an operation 1410, a characteristic of a dynamic strobe signal is determined. The characteristic of the dynamic strobe signal is configured to limit a peak current level through the plurality of sense modules. For example, the peak current level of the dynamic strobe signal may be limited while the programming pulses are applied to the array of memory cells. In an operation 1415, the dynamic strobe signal to the plurality of sense modules is applied in order to sense, via the bit lines, a state of the memory cells. The dynamic strobe signal can vary based on the determined characteristic of the dynamic strobe signal. In various embodiments, the dynamic strobe signal may vary in different ways according to various embodiments disclosed herein, such as the embodiments discussed above with respect to FIGS. 8-13.

Figure 15:
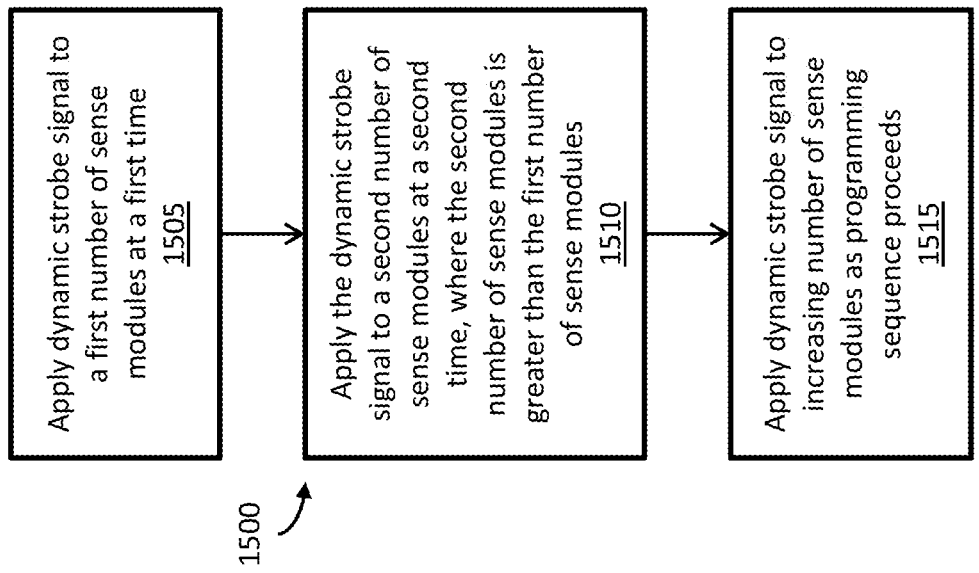
FIG. 15 depicts a method of operation of a circuit used to apply a dynamic strobe signal with a variable strobe skew in accordance with an illustrative embodiment.

FIG. 15 depicts a method 1500 of operation of a circuit used to apply a dynamic strobe signal with a variable strobe skew in accordance with an illustrative embodiment. In an operation 1505, a dynamic strobe signal is applied to a first number of sense modules at a first time during the programming pulses. The first number of sense modules may represent a first subset of the total plurality of sense modules. In this way, the dynamic strobe signal is not applied to all of the plurality of sense modules at one time, limiting the peak current level through the plurality of sense modules at any given time. In an embodiment, the number of sense modules to which the dynamic strobe signal is applied to at the first time may be based on a program loop number of the programming pulses. For example, each of the programming pulses may be part of a programming sequence, where each of the programming pulses has a unique program loop number. In some embodiments, the program pulses may be associated with different types of programming of the memory cells, such as erase, read, write, etc. The controller can be configured to determine how many sense modules the dynamic strobe signal is applied to based on the unique program loop number, which may be associated with different types of programming. In some embodiments, a look up table (LUT) may be used, where the number of sense modules to apply the dynamic strobe signal to is correlated to the program loop number in the LUT. In some embodiments, the dynamic strobe signal is applied to an increasing number of the plurality of sense modules as the programming sequence proceeds and the unique program loop numbers get higher. Therefore, in FIG. 15, a dynamic strobe signal with a variable strobe skew is applied.

In some embodiments, the number of sense modules to which the dynamic strobe signal is applied is based on a predicted peak current of the dynamic strobe signal. For example, a controller may predict how high a peak current will be based on how many memory cells are already locked out and therefore do not need to be sensed. In another example, the controller may predict how high the peak current will be based on a type of programming pulse that is being applied. In another example, the controller may predict how high the peak current will be based on the unique program loop number of the programming pulse being applied.

In an operation 1510, after the dynamic strobe signal is applied to a first number of sense modules at a first time according to the determined characteristic, the dynamic strobe signal is applied to a second number of sense modules at a second time according to the determined characteristic. The second number of sense modules may include a second subset of the plurality of sense modules. The second subset of the plurality of sense modules may be a larger number of memory cells than the first subset of memory cells. In some embodiments, the first subset of memory cells may be locked out at the second time. In an operation 1515, the dynamic strobe signal is applied to an increasing number of sense modules as the programming sequence further proceeds.

FIG. 16 depicts a method 1600 of operation of a circuit used to apply a dynamic strobe signal based on a predetermined condition in accordance with an illustrative embodiment. In an operation 1605, a first programming pulse is applied to an array of memory cells. in an operation 1610, a first subset of memory cells to sense is determined based on a predetermined condition. The first subset of memory cells is configured to limit a peak current of a dynamic strobe signal to be below a predetermined threshold during a sense operation. In an operation 1615, a state of the first subset of memory cells is sensed by applying the dynamic strobe signal to an associated first subset of sense modules. The first subset of sense modules may be connected to a plurality of bit lines spanning the array of memory cells. In an operation 1620, a second programming pulse is applied to the array of memory cells. Each of the memory cells may include transistors that are configured to be programmed to one of sixteen states. In some embodiments, the memory cells may be programmed to different numbers of states than sixteen.

In an operation 1625, a second subset of memory cells to sense is determined based on the predetermined condition. In an operation 1630, after the second programming pulse, the second subset of memory cells is sensed by applying the dynamic strobe signal to an associated second subset of the sense modules. In some embodiments, the predetermined condition may be whether the memory cells are in an erase state or other state. For example, the first subset of memory cells may be memory cells in an erase state, while the second subset of memory cells may be memory cells in a non-erase state. Often, sensing a memory cell that is in an erase state draws more current than sensing a memory cell in a non-erase state. Accordingly, sensing some erase state cells with the dynamic strobe signal first and some non-erase state cells with the dynamic strobe signal second can limit the peak current level through the sense modules to an appropriate level, while still completing program loops and sense operations efficiently. In some embodiments, the predetermined condition may be a program loop count of a plurality of programming pulses, such that the memory cells that are sensed at a given time is based on how many program loops have been performed at the given time. As memory cells become programmed and/or locked out, more cells may be sensed with the dynamic strobe signal without exceeding an acceptable current level of the dynamic strobe signal.

Figure 17:
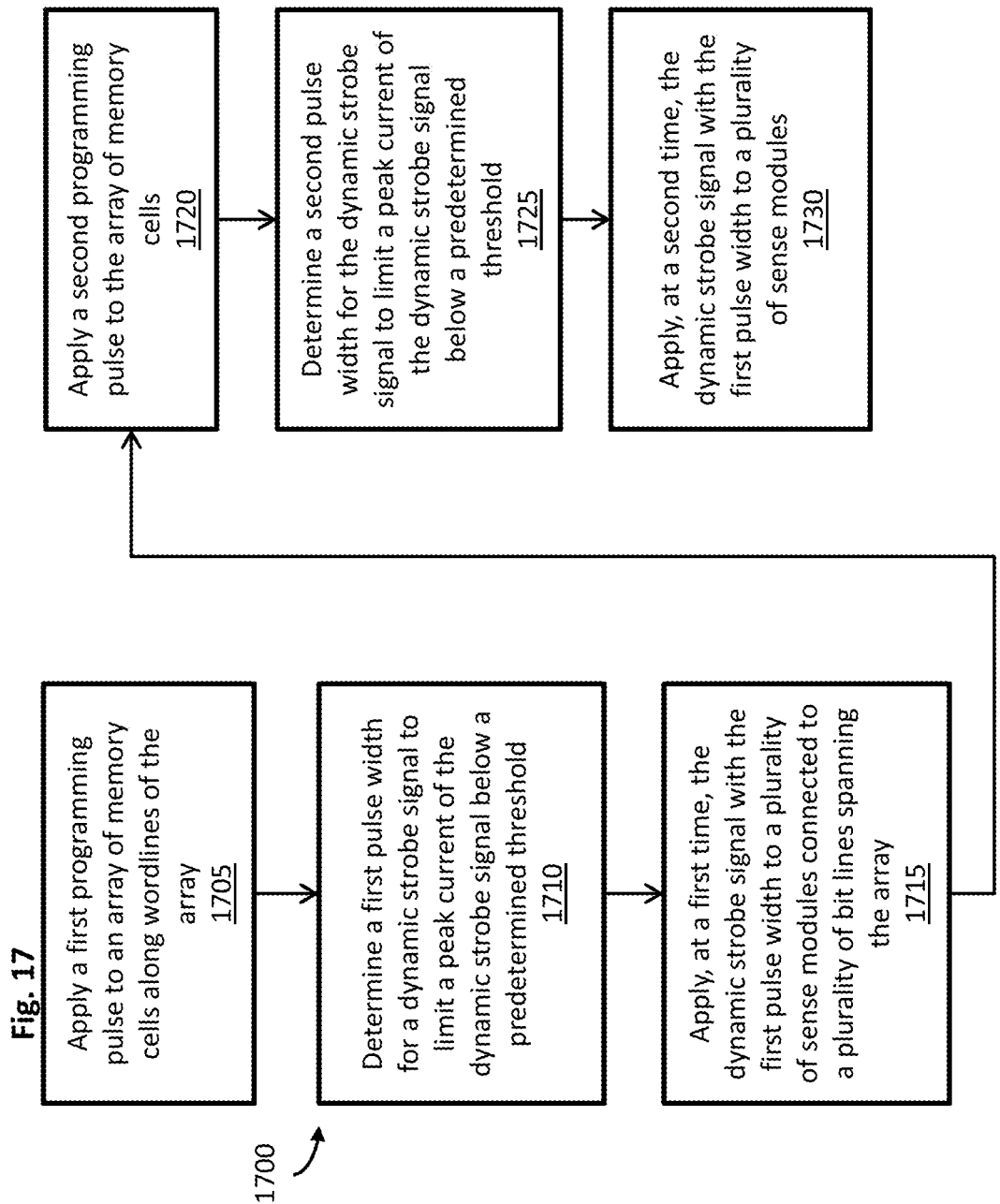
FIG. 17 depicts a method of operation of a circuit used to apply a dynamic strobe signal with a variable pulse width in accordance with an illustrative embodiment.

FIG. 17 depicts a method 1700 of operation of a circuit used to apply a dynamic strobe signal with a variable pulse width in accordance with an illustrative embodiment. In an operation 1705, a first programming pulse is applied to an array of memory cells along wordlines of the array. In an operation 1710, a first pulse width for a dynamic strobe signal is determined based on a predetermined condition. The first pulse width may be configured to limit a peak current of the dynamic strobe signal below a predetermined threshold during a sense operation. In an operation 1715, a state of the memory cells is sensed by applying, at a first time, the dynamic strobe signal with the first pulse width to a plurality of sense modules connected to a plurality of bit lines spanning the array. In an operation 1720, a second programming pulse is applied to the array of memory cells. In an operation 1725, a second pulse width for the dynamic strobe signal is determined based on a predetermined condition, which may be the same predetermined condition. In an operation 1730, a state of the memory cells is sensed by applying, at a second time, the dynamic strobe signal with the second pulse width to a plurality of sense modules connected to a plurality of bit lines spanning the array.

The following description is directed to certain implementations for the purposes of describing the innovative characteristics of this disclosure. However, a person having ordinary skill in the art will readily recognize that the teachings herein can be applied in a multitude of different ways. The described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/ navigators, cameras, digital media players (such as MP3 players), camcorders, game consoles, wrist watches, wearable devices, clocks, calculators, television monitors, flat panel displays, electronic reading devices (such as e-readers), computer monitors, auto displays (such as odometer and speedometer displays), cockpit controls and displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, in addition to non-EMS applications), aesthetic structures (such as display of images on a piece of jewelry or clothing) and a variety of EMS devices.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the characteristics disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more characteristics, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, a person having ordinary skill in the art will readily appreciate, directional terms are sometimes used for ease of describing the figures, and indicate relative positions corresponding to the orientation of the figure on a properly oriented page, and may not reflect the proper orientation of any device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. An apparatus comprising:
    an array of memory cells;
    a plurality of bit lines spanning the array of memory cells;
    a plurality of sense modules connected to the bit lines, the plurality of sense modules configured to enable sensing of states of the array of memory cells; and
    a controller configured to:
        apply programming pulses to the array of memory cells;
        determine a characteristic of a dynamic strobe signal to limit a peak current level through the plurality of sense modules, wherein the characteristic comprises at least one of a skew of the dynamic strobe signal that varies over time with respect to a number of the plurality of sense modules to which the dynamic strobe signal is applied or a pulse width of the dynamic strobe signal; and
        apply the dynamic strobe signal to the plurality of sense modules to sense, via the bit lines, a state of the memory cells, wherein the dynamic strobe signal varies based on the determined characteristic of the dynamic strobe signal.

2. The apparatus of claim 1, wherein the skew of the dynamic strobe signal comprises a first number of sense modules to which the dynamic strobe signal is to be applied at a first time, and wherein the first number of sense modules comprises a first subset of the plurality of sense modules.

3. The apparatus of claim 2, wherein the first number of sense modules is based on a program loop number of the programming pulses, and wherein each of the programming pulses are part of a programming sequence and have a unique program loop number.

4. The apparatus of claim 3, wherein application of the dynamic strobe signal comprises application of the dynamic strobe signal to an increasing number of the plurality of sense modules as the programming sequence proceeds.

5. The apparatus of claim 2, wherein the first number of sense modules is based on a predicted peak current of the dynamic strobe signal.

6. The apparatus of claim 2, wherein the skew of the dynamic strobe signal further comprises a second number of sense modules to which the dynamic strobe signal is to be applied at a second time, wherein the second number of sense modules comprises a second subset of the plurality of sense modules, and wherein the controller is further configured to:

apply the dynamic strobe signal to the first subset of sense modules associated with a first subset of memory cells after a first programming pulse; and apply the dynamic strobe signal to the second subset of sense modules associated with a second subset of memory cells after a second programming pulse.

7. The apparatus of claim 6, wherein the second subset of memory cells comprises a larger number of memory cells than the first subset of memory cells.

8. The apparatus of claim 6, wherein the first subset of memory cells are locked out at the second time.

9. The apparatus of claim 1, wherein the pulse width of the dynamic strobe signal comprises a first pulse width of a first portion of the dynamic strobe signal applied at a first time and a second pulse width of a second portion of the strobe signal applied at second time, and wherein the first pulse width and the second pulse width are of different durations of time.

10. The apparatus of claim 1, wherein the characteristic of the dynamic strobe signal comprises the skew, and wherein determining the characteristic comprises determining a first subset of the plurality of sense modules to be activated at a first time and a second subset of the plurality of sense modules to are activated at a second time, and wherein the second subset has a greater number of the plurality of sense modules than the first subset.

11. The apparatus of claim 2, wherein the first number of sense modules is based upon a state of the array of memory cells.

12. A method comprising:

applying a first programming pulse to an array of memory cells along wordlines of the array of memory cells;

determining a first subset of the array of memory cells for applying a dynamic strobe signal to limit a peak current through a plurality of sense modules connected to the array of memory cells;

applying the dynamic strobe signal to first sense modules of the plurality of sense modules connected to the first subset of the array of memory cells;

applying a second programming pulse to the array of memory cells;

determining a second subset of the array of memory cells for applying the dynamic strobe signal to limit the peak current through the plurality of sense modules; and applying the dynamic strobe signal to second sense modules of the plurality of sense modules connected to the second subset of the array of memory cells, wherein a number of the second sense modules is greater than a number of the first sense modules.

13. The method of claim 12, wherein the number of the first sense modules and the number of the second sense modules is determined to limit the peak current below a predetermined threshold.

14. The method of claim 12, wherein the number of the first sense modules and the number of the second sense modules is determined based on at least one of:

a program loop count of a plurality of programming pulses; and a type of programming pulse applied to the array of memory cells.

15. The method of claim 12, wherein the number of the first sense modules and the number of the second sense modules is determined based on at least one of:

a known state of the array of memory cells; or a measured peak current of the dynamic strobe signal.

* * * * *